United States Patent
Sutardja

(10) Patent No.: US 7,505,537 B1
(45) Date of Patent: Mar. 17, 2009

(54) SYSTEM AND METHOD FOR CONTROLLING GAIN AND TIMING PHASE IN A PRESENCE OF A FIRST LEAST MEAN SQUARE FILTER USING A SECOND ADAPTIVE FILTER

(75) Inventor: Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 749 days.

(21) Appl. No.: 10/788,998

(22) Filed: Feb. 27, 2004

Related U.S. Application Data

(60) Provisional application No. 60/457,717, filed on Mar. 25, 2003.

(51) Int. Cl.
*H04L 27/08* (2006.01)
(52) U.S. Cl. .................. 375/345; 375/350; 375/355
(58) Field of Classification Search ............... 375/319, 375/350, 229–230, 232, 354, 355, 345; 708/300, 708/322, 323
See application file for complete search history.

(56) References Cited

U.S. PATENT DOCUMENTS

| | | | | |
|---|---|---|---|---|
| 4,757,519 | A | * | 7/1988 | Collison et al. ............. 375/296 |
| 5,243,624 | A | * | 9/1993 | Paik et al. .................. 375/232 |
| 5,512,959 | A | * | 4/1996 | D'Alto et al. ............... 348/614 |
| 5,825,318 | A | * | 10/1998 | Patapoutian et al. ........ 341/131 |
| 5,995,545 | A | * | 11/1999 | Ueno ......................... 375/233 |
| 5,999,355 | A | * | 12/1999 | Behrens et al. ............. 360/65 |
| 6,208,481 | B1 | * | 3/2001 | Spurbeck et al. ............ 360/65 |
| 6,249,398 | B1 | * | 6/2001 | Fisher et al. ................ 360/65 |
| 6,272,173 | B1 | | 8/2001 | Hatamian |
| 6,381,085 | B1 | | 4/2002 | Du et al. |
| 6,389,069 | B1 | * | 5/2002 | Mathe ......................... 375/232 |
| 6,449,110 | B1 | * | 9/2002 | DeGroat et al. ............... 360/46 |
| 6,477,200 | B1 | | 11/2002 | Agazzi et al. |
| 6,513,141 | B1 | * | 1/2003 | Livingston ................... 714/792 |
| 6,526,105 | B1 | * | 2/2003 | Harikumar et al. .......... 375/350 |
| 6,804,695 | B1 | * | 10/2004 | Hsu ............................ 708/322 |
| 6,819,514 | B1 | * | 11/2004 | Behrens et al. ............... 360/65 |
| 6,829,296 | B1 | * | 12/2004 | Troulis et al. ................ 375/232 |
| 6,980,592 | B1 | * | 12/2005 | Rambaud et al. ............ 375/232 |
| 7,012,772 | B1 | * | 3/2006 | Vis .............................. 360/46 |
| 2003/0052805 | A1 | * | 3/2003 | Troy et al. ................... 341/143 |
| 2003/0112861 | A1 | * | 6/2003 | Erdogan et al. ............. 375/232 |
| 2003/0174783 | A1 | * | 9/2003 | Rahman et al. ............. 375/298 |
| 2004/0013190 | A1 | * | 1/2004 | Jayaraman et al. .......... 375/233 |
| 2005/0041760 | A1 | * | 2/2005 | Yousef ........................ 375/340 |

FOREIGN PATENT DOCUMENTS

WO     WO 01/78339 A1     9/2001

\* cited by examiner

*Primary Examiner*—Jean B Corrielus

(57) ABSTRACT

A system for controlling gain and timing phase includes a variable gain amplifier (VGA) responsive to an input signal, and an analog-to-digital converter (ADC) responsive to a VGA output. A first filter, with tap weight coefficients updated by a first least mean square (LMS) engine, is responsive to an ADC output. At least one tap weight coefficient of the first filter is constrained. A second filter, with tap weight coefficients updated by an adaptation engine, is responsive to a first filter output. The complexity of the second filter is less than or equal to the complexity of the first filter. The system includes: a timing phase controller, in communication with the ADC and responsive to a second filter output, for controlling ADC timing phase; and/or a gain controller, in communication with the VGA and responsive to the second filter output, for controlling VGA gain.

147 Claims, 8 Drawing Sheets

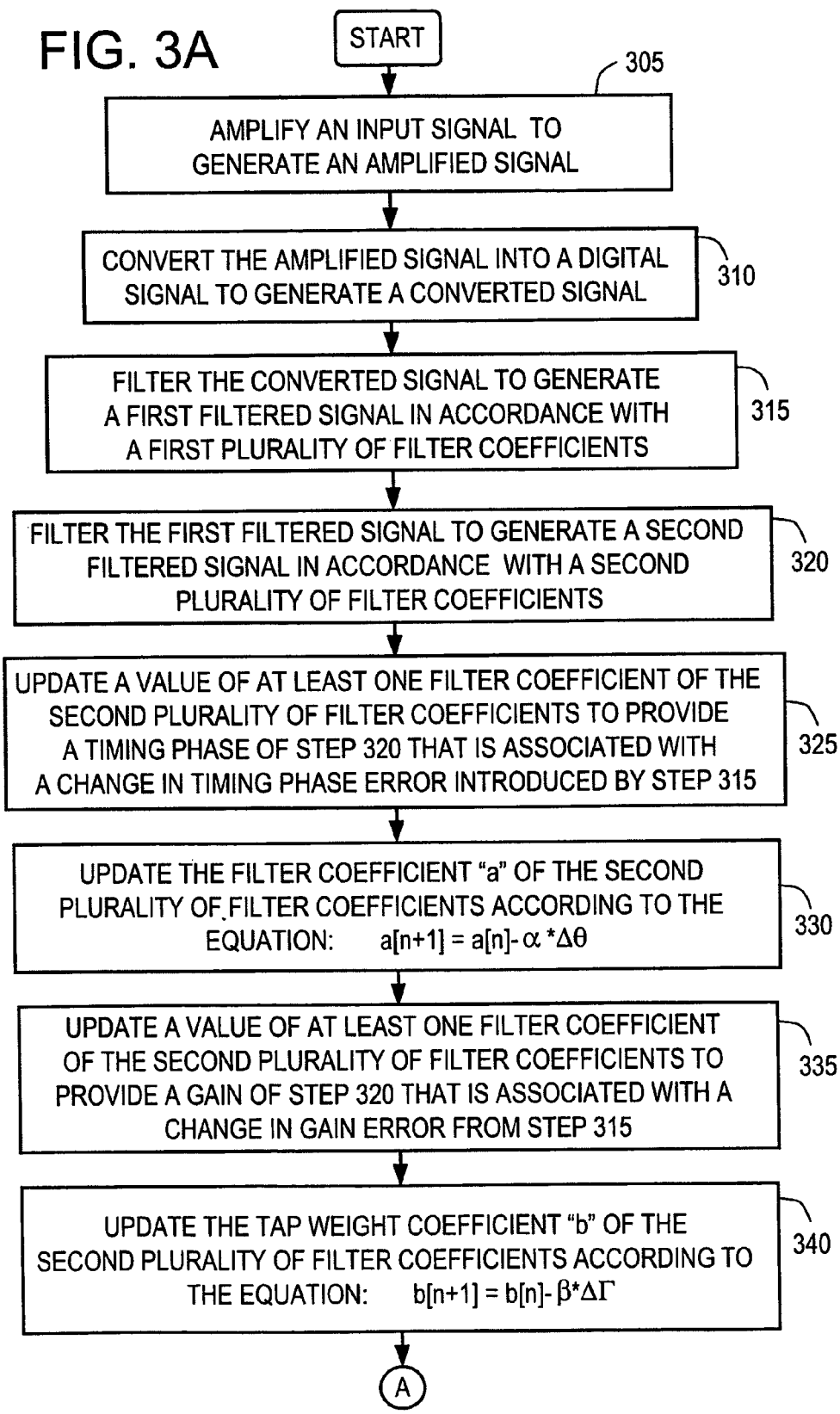

SYSTEM AND METHOD FOR CONTROLLING GAIN AND TIMING PHASE IN A PRESENCE OF A FIRST LEAST MEAN SQUARE FILTER USING A SECOND ADAPTIVE FILTER

This application claims priority under 35 U.S.C. § 119(e) to U.S. Provisional Application No. 60/457,717, filed on Mar. 25, 2003, the entire content of which is hereby incorporated herein by reference.

BACKGROUND

1. Field of the Invention

The present invention relates to Least Mean Square (LMS) filters. More particularly, the present invention relates to a system and method for controlling gain and timing phase in the presence of a first LMS filter using a second adaptive filter.

2. Background Information

The Least Mean Square (LMS) adaptation algorithm is known to provide good error rate performance for sequence detectors in applications such as, for example, digital data detectors (e.g., read channel devices for magnetic recording), data communication and the like. The LMS algorithm is updated according to Equation (1):

$$C_N(n+1) = C_N(n) + \mu * E(n) * X_N(n) \quad (1)$$

According to Equation (1), $C_N(n+1)$ is a vector of N tap weight coefficients of a filter for the next iteration (i.e., the next time sampling interval of the input signal), i.e., $C_N(n+1) = [C_0(n+1), C(n+1), \ldots, C_{N-1}(n+1)]$. The filter can be, for example, a Finite Impulse Response (FIR) filter or an Infinite Impulse Response filter. A FIR filter produces an output that is a weighted sum of the current and past inputs to the filter. An IIR filter produces an output that is a weighted sum of the current and past inputs to the filter and past outputs of the filter. In Equation (1), $C_N(n)$ is a vector of N tap weight coefficients of the filter for the current iteration (i.e., the current sampling interval of the input signal), i.e., $C_N(n) = [C_0(n), C_1(n), \ldots, C_{N-1}(n)]$. The gain constant or step-size parameter $\mu$ is a scalar value that generally controls the rate at which the LMS algorithm converges, with its value generally being between, for example, zero and one. $E(n)$ is a scalar value representing the error between the value of the signal input to the filter and the ideal noiseless value of that input signal. For data communication, an output of the filter can be in communication with an input of a sequence detector, and an output of the sequence detector can be in communication with an input of a reconstruction filter, a target channel response filter, or the like. The ideal noiseless value can be estimated by convolving the output of the sequence detector with the target channel response. In Equation (1), $X_N(n)$ is a vector of N delayed input samples to the filter, i.e., $X_N(n) = [X(k), X(k-1), \ldots, X(k-(N-1))]$.

In data communication receivers with gain recovery and/or timing phase recovery, it is generally necessary to constrain the LMS algorithm to minimize the interaction between the LMS adaptation and the gain and timing phase recovery. For example, for a filter having tap weight coefficients updated according to the LMS algorithm, at least two of the main tap weight coefficients of the filter can be constrained and not adapted. A Zero-Forcing (ZF) Automatic Gain Control (AGC) algorithm can be used to control the gain of the system. In such a configuration, there can be an undesirable interaction between the filter having tap weight coefficients updated according to the LMS algorithm and the ZF AGC. In the presence of signal noise, minimization of the Mean Square Error (MSE) by the LMS algorithm on the input signal through the filter can require that the gain of the system be slightly lowered relative to the noiseless case. However, the ZF AGC algorithm generally does not make adjustments to the overall gain setting, even in the presence of noise. With the ZF AGC algorithm maintaining a higher gain than desired by the filter having tap weight coefficients updated according to the LMS algorithm, the resultant higher-gain situation can cause the constrained LMS algorithm to converge to a sub-optimal state that can be far from the optimal error rate performance of the data receiver.

In addition, there can be another bias (or biases) in the timing phase recovery of the data receiver. This can be caused by, for example, implementation inaccuracy (e.g., quantization effects), data pattern dependencies (e.g., highly asymmetric waveforms), and the like. The constrained LMS algorithm generally cannot correct for the bias condition properly, because two or more of the main tap weight coefficients of the filter are not allowed to adapt. Consequently, the tap weight coefficients that are allowed to adapt can over-correct, which can result in the tap weight coefficients of the filter converging to a state that also yields sub-optimal error rate performance.

SUMMARY OF THE INVENTION

A method and system are disclosed for a system and method for controlling gain and timing phase in the presence of a first Least Mean Square (LMS) filter using a second adaptive filter. In accordance with exemplary embodiments, according to a first aspect of the present invention, an information communication system can include a variable gain amplifier (VGA). The VGA can be responsive to an input signal of the information communication system. The information communication system can include an analog-to-digital converter (ADC). The ADC can be responsive to an output of the VGA. The information communication system can include a first filter. Tap weight coefficients of the first filter can be updated according to a first least mean square (LMS) engine. The first filter can be responsive to an output of the ADC. At least one tap weight coefficient of the first filter can be constrained. The information communication system can include a second filter. Tap weight coefficients of the second filter can be updated according to an adaptation engine. The adaptation engine can comprise a second LMS engine or a zero-forcing engine. The second filter can be responsive to an output of the first filter. The number of tap weight coefficients of the second filter can be less than or equal to the number of the tap weight coefficients of the first filter. The information communication system can include either or both of a gain controller for controlling gain of the VGA, wherein the gain controller can in communication with the VGA and responsive to the output of the second filter, and a timing phase controller for controlling timing phase of the ADC, wherein the timing phase controller can be in communication with the ADC and responsive to an output of the second filter.

According to an exemplary embodiment of the first aspect, at least two tap weight coefficients of the first filter can be constrained. A value of at least one tap weight coefficient of the second filter can be updated to provide a gain of the second filter that is associated with a change in gain error from the first filter. The gain of the second filter can be configured to cause the gain controller to modify a gain of the VGA to compensate for the change in gain error from the first filter. Additionally or alternatively, a value of at least one tap weight coefficient of the second filter can be updated to provide a timing phase of the second filter that is associated with a change in timing phase error introduced by the first filter. The timing phase of the second filter can be configured to cause the timing phase controller to modify a timing phase of the ADC to compensate for the change in timing phase error introduced by the first filter.

According to the first aspect, the second filter can comprise either a two-tap filter or a three-tap filter. For example, the tap weight coefficients of the two-tap filter can comprise "a" and "1+b", respectively, and the tap weight coefficients of the three-tap filter can comprise "a", "1+b", and "−a", respectively. The tap weight coefficient "a" can be updated according to the equation:

$$a[n+1]=a[n]-\alpha*\Delta\theta,$$

wherein a[n+1] comprises the value of the tap weight coefficient "a" for the next sampling time of the input signal, a[n] comprises the value of the tap weight coefficient "a" for the current sampling time of the input signal, α comprises a first gain constant, and Δθ comprises the change in timing phase error associated with the first filter.

According to an exemplary embodiment of the first aspect, the first filter can comprise N tap weight coefficients, wherein N comprises at least four. For purposes of illustration and not limitation, a third tap weight coefficient $C_3$ and a fourth tap weight coefficient $C_4$ of the first filter can be constrained. Thus, Δθ can be updated according to the equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to the equations:

$$\Delta C_3 = \mu*E[n]*X[n-3] \text{ and}$$

$$\Delta C_4 = \mu*E[n]*X[n-4], \text{ respectively,}$$

wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the first aspect, $K_e$ and $K_o$ can be updated according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, M can be determined according to the equation:

$$M=\text{TRUNCATE}((N-1)/2), \text{ and}$$

P can be determined according to the equation:

$$P=\text{TRUNCATE}(((N-1)/2)-0.5).$$

According to an alternative exemplary embodiment of the first aspect, $K_e$ and $K_o$ can each comprise a predetermined value. The error signal E[n] can comprise the difference between an output of the first filter and the output of a reconstruction filter. The reconstruction filter can be responsive to an output of a sequence detector. The sequence detector can be responsive to an output of the first filter.

According to an alternative exemplary embodiment of the first aspect, the first filter can comprise N tap weight coefficients, wherein N comprises at least four. For purposes of illustration and not limitation, a third tap weight coefficient $C_3$ and a fourth tap weight coefficient $C_4$ of the first filter can be constrained. Thus, Δθ can be updated according to the equation:

$$\Delta\theta=(-\Delta C_3*K_e-\Delta C_4*K_o),$$

wherein $\Delta C_3$ and $\Delta C_4$ are updated according to the equations:

$$\Delta C_3=\mu*E[n]*X[n-3] \text{ and}$$

$$\Delta C_4=\mu*E[n]*X[n-4], \text{ respectively,}$$

wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the first aspect, $K_e$ and $K_o$ can be updated according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, M can be determined according to the equation:

$$M=\text{TRUNCATE}((N-1)/2), \text{ and}$$

P can be determined according to the equation:

$$P=\text{TRUNCATE}(((N-1)/2)-0.5).$$

According to an alternative exemplary embodiment of the first aspect, $K_e$ and $K_o$ can each comprise a predetermined value.

According to the first aspect, the information communication system can include a sequence detector. The sequence detector can be responsive to an output of the first filter. The information communication system can include a reconstruction filter. The reconstruction filter can be responsive to an output of the sequence detector. The information communication system can also include an error generator. The error generator can be responsive to the output of the first filter and an output of the reconstruction filter. The error generator can generate the error signal E[n] comprising a difference between the output of the first filter and the output of the reconstruction filter.

According to the first aspect, the tap weight coefficient "b" can be updated according to the equation:

$$b[n+1]=b[n]-\beta*\Delta\Gamma,$$

wherein b[n+1] comprises the value of the tap weight coefficient "b" for the next sampling time of the input signal, b[n] comprises the value of the tap weight coefficient "b" for the current sampling time of the input signal, β comprises a first gain constant, and ΔΓ comprises the change in gain error from the first filter. According to an exemplary embodiment of the first aspect, the first filter can comprise N tap weight coefficients, wherein N comprises at least four. For purposes of illustration and not limitation, a third tap weight coefficient $C_3$ and a fourth tap weight coefficient $C_4$ of the first filter can be constrained. Thus, ΔΓ can be updated according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$$\Delta C_3 = \mu*E[n]*X[n-3] \text{ and}$$

$$\Delta C_4 = \mu*E[n]*X[n-4], \text{ respectively,}$$

wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the first aspect, $K_e$ and $K_o$ can be updated according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, M can be determined according to the equation:

$$M = \text{TRUNCATE}((N-1)/2), \text{ and}$$

P can be determined according to the equation:

$$P = \text{TRUNCATE}(((N-1)/2)-0.5).$$

According to an alternative exemplary embodiment of the first aspect, $K_e$ and $K_o$ can each comprise a predetermined value. The error signal E[n] can comprise the difference between the output of the first filter and the output of the reconstruction filter.

According to an alternative exemplary embodiment of the first aspect, the first filter can comprise N tap weight coefficients, wherein N comprises at least four. For purposes of illustration and not limitation, a third tap weight coefficient $C_3$ and a fourth tap weight coefficient $C_4$ of the first filter can be constrained. Thus, ΔΓ can be updated according to the equation:

$$\Delta\Gamma = (-\Delta C_3 * K_o + \Delta C_4 * K_e),$$

wherein $\Delta C_3$ and $\Delta C_4$ are updated according to the equations:

$$\Delta C_3 = \mu*E[n]*X[n-3] \text{ and}$$

$$\Delta C_4 = \mu*E[n]*X[n-4], \text{ respectively,}$$

wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the first aspect, $K_e$ and $K_o$ can be updated according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, M can be determined according to the equation:

$$M = \text{TRUNCATE}((N-1)/2), \text{ and}$$

P can be determined according to the equation:

$$P = \text{TRUNCATE}(((N-1)/2)-0.5).$$

According to an alternative exemplary embodiment of the first aspect, $K_e$ and $K_o$ can each comprise a predetermined value. The error signal E[n] can comprise the difference between the output of the first filter and the output of the reconstruction filter.

According to the first aspect, the information communication system can include an error generator responsive to an output of the reconstruction filter. The error generator can be in communication between an output of the second filter and inputs of the timing phase controller and the gain controller. According to an alternative exemplary embodiment of the first aspect, the timing phase controller can comprise the error generator. The timing phase controller can be responsive to the output of the reconstruction filter. According to the alternative exemplary embodiment, the gain controller can comprise the error generator. The gain controller can be responsive to the output of the reconstruction filter. The first filter and the second filter can each comprise a Finite Impulse Response filter. According to an exemplary embodiment of the first aspect, a disk drive can comprise the information communication system. At least the VGA, ADC, first filter, second filter, and at least one of the timing phase controller and gain controller can be formed on a monolithic substrate. The information communication system can be compliant with a standard selected from the group consisting of 802.11, 802.11a, 802.11b, 802.11g and 802.11i.

According to a second aspect of the present invention, a method for controlling at least one of gain and timing phase can comprise the steps of: a.) amplifying an input signal to generate an amplified signal; b.) converting the amplified signal into a digital signal to generate a converted signal; c.) filtering the converted signal to generate a first filtered signal in accordance with a first plurality of filter coefficients, wherein the first plurality of filter coefficients are updated according to a first LMS process, and wherein at least one filter coefficient of the first plurality of filter coefficients is constrained; d.) filtering the first filtered signal to generate a second filtered signal in accordance with a second plurality of filter coefficients, wherein the second plurality of filter coefficients of the second filter are updated according to an adaptation process, and wherein a number of filter coefficients of the second plurality of filter coefficients comprises one of less than and equal to a number of the filter coefficients of the first plurality of filter coefficients; e.) controlling a gain of step (a.) in response to the second filtered signal; and f.) controlling a timing phase of step (b.) in response to the second filtered signal. The adaptation process used to update the second plurality of filter coefficients can comprise a second LMS process or a zero-forcing process.

According to an exemplary embodiment of the second aspect, at least two filter coefficients of the first plurality of filter coefficients can be constrained. The method can include the steps of: g.) updating a value of at least one filter coefficient of the second plurality of filter coefficients to provide a gain of step (d.) that is associated with a change in gain error from step (c.); and h.) modifying the gain of step (a.) based upon the gain of step (d.), to compensate for the change in gain error from step (c.). Additionally or alternatively, the method can include the steps of: g.) updating a value of at least one filter coefficient of the second plurality of filter coefficients to provide a timing phase of step (d.) that is associated with a change in timing phase error introduced by step (c.); and h.) modifying a timing phase of step (b.) based upon the timing phase of step (d.), to compensate for the change in timing phase error introduced by step (c.).

According to an exemplary embodiment of the second aspect, the second plurality of filter coefficients can comprise two or three filter coefficients. The two filter coefficients of the second plurality of filter coefficients can comprise "a" and "1+b", respectively, and the three filter coefficients of the second plurality of filter coefficients can comprise "a", "1+b", and "−a", respectively. The method can include the step of: g.) updating the filter coefficient "a" according to the equation:

$$a[n+1]=a[n]-\alpha*\Delta\theta,$$

wherein a[n+1] comprises the value of the tap weight coefficient "a" for the next sampling time of the input signal, a[n] comprises the value of the tap weight coefficient "a" for the current sampling time of the input signal, $\alpha$ comprises a first gain constant, and $\Delta\theta$ comprises the change in timing phase error associated with step (c.).

According to an exemplary embodiment of the second aspect, the first plurality of filter coefficients can comprise N filter coefficients, wherein N comprises at least four. For purposes of illustration and not limitation, a third filter coefficient $C_3$ and a fourth filter coefficient $C_4$ of the first plurality of filter coefficients can be constrained. The method can comprise the steps of: h.) updating $\Delta\theta$ according to the equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to the equations:

$$\Delta C_3 = \mu*E[n]*X[n-3] \text{ and}$$

$$\Delta C_4 = \mu*E[n]*X[n-4], \text{ respectively,}$$

wherein $\mu$ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal; and i.) updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein $\gamma$ comprises a "+1" when ((2*n) modulo 4)=0 and comprises a "−1" otherwise, M can be determined according to the equation:

$$M=\text{TRUNCATE}((N-1)/2), \text{ and}$$

P can be determined according to the equation:

$$P=\text{TRUNCATE}(((N-1)/2)-0.5).$$

According to an alternative exemplary embodiment of the second aspect, $K_e$ and $K_o$ can each comprise a predetermined value. The method can further comprise the steps of: i.) detecting an information sequence in the first filtered signal; j.) reconstructing an information signal from the detected information sequence; and k.) generating the error signal E[n] comprising a difference between the first filtered signal and the reconstructed information signal.

According to an alternative exemplary embodiment of the second aspect, the first plurality of filter coefficients can comprise N filter coefficients, wherein N comprises at least four. For purposes of illustration and not limitation, a third filter coefficient $C_3$ and a fourth filter coefficient $C_4$ of the first plurality of filter coefficients can be constrained. The method can include the steps of: h.) updating $\Delta\theta$ according to the equation:

$$\Delta\theta=(-\Delta C_3*K_e-\Delta C_4*K_o),$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein $\mu$ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal; and i.) updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein $\gamma$ comprises a "+1" when ((2*n) modulo 4)=0 and comprises a "−1" otherwise, M can be determined according to the equation:

$$M = \text{TRUNCATE}((N-1)/2), \text{ and}$$

P can be determined according to the equation:

$$P = \text{TRUNCATE}(((N-1)/2) - 0.5).$$

According to an alternative exemplary embodiment of the second aspect, $K_e$ and $K_o$ can each comprise a predetermined value. The method can further comprise the steps of: i.) detecting an information sequence in the first filtered signal; j.) reconstructing an information signal from the detected information sequence; and k.) generating the error signal E[n] comprising a difference between the first filtered signal and the reconstructed information signal.

According to the second aspect, the method can include the step of: g.) updating the tap weight coefficient "b" according to the equation:

$$b[n+1] = b[n] - \beta * \Delta \Gamma,$$

wherein b[n+1] comprises the value of the tap weight coefficient "b" for the next sampling time of the input signal, b[n] comprises the value of the tap weight coefficient "b" for the current sampling time of the input signal, β comprises a first gain constant, and ΔΓ comprises the change in gain error from step (c.). According to an exemplary embodiment of the second aspect, the first plurality of filter coefficients can comprise N filter coefficients, wherein N comprises at least four. For purposes of illustration and not limitation, a third filter coefficient $C_3$ and a fourth filter coefficient $C_4$ of the first plurality of filter coefficients can be constrained. The method can include the steps of: h.) updating ΔΓ according to equation:

$$\Delta \Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein $\mu$ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal; and i.) updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein $\gamma$ comprises a "+1" when ((2*n) modulo 4)=0 and comprises a "−1" otherwise, M can be determined according to the equation:

$$M = \text{TRUNCATE}((N-1)/2), \text{ and}$$

P can be determined according to the equation:

$$P = \text{TRUNCATE}(((N-1)/2) - 0.5).$$

According to an alternative exemplary embodiment of the second aspect, $K_e$ and $K_o$ can each comprise a predetermined value. The method can further comprise the steps of: i.) detecting an information sequence in the first filtered signal; j.) reconstructing an information signal from the detected information sequence; and k.) generating the error signal E[n] comprising a difference between the first filtered signal and the reconstructed information signal.

According to an alternative exemplary embodiment of the second aspect, the first plurality of filter coefficients can comprise N filter coefficients, wherein N comprises at least four. For purposes of illustration and not limitation, a third filter coefficient $C_3$ and a fourth filter coefficient $C_4$ of the first plurality of filter coefficients can be constrained. The method can comprise the steps of: h.) updating ΔΓ according to the equation:

$$\Delta \Gamma = (-\Delta C_3 * K_o + \Delta C_4 * K_e),$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal; and i.) updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, M can be determined according to the equation:

$M = \text{TRUNCATE}((N-1)/2)$, and

P can be determined according to the equation:

$P = \text{TRUNCATE}(((N-1)/2)-0.5)$.

According to an alternative exemplary embodiment of the second aspect, $K_e$ and $K_o$ can each comprise a predetermined value. The method can further comprise the steps of: i.) detecting an information sequence in the first filtered signal; j.) reconstructing an information signal from the detected information sequence; and k.) generating the error signal E[n] comprising a difference between the first filtered signal and the reconstructed information signal.

According to the second aspect, the method can include the steps of: g.) detecting an information sequence in the first filtered signal; h.) reconstructing an information signal from the detected information sequence; and i.) generating an error signal, wherein the error signal is associated with the reconstructed information signal. The method can be compliant with a standard selected from the group consisting of 802.11, 802.11a, 802.11b, 802.11g and 802.11i.

According to a third aspect of the present invention, an information communication system can include means for amplifying an input signal received by the information communication system to generate an amplified signal. The information communication system can include means for converting the amplified signal into a digital signal to generate a converted signal. The information communication system can include first means for filtering the converted signal to generate a first filtered signal. Tap weight coefficients of the first means for filtering can be updated according to a first LMS adaptation means. At least one tap weight coefficient of the first means for filtering is constrained. The information communication system can include second means for filtering the first filtered signal to generate a second filtered signal. Tap weight coefficients of the second means for filtering can be updated according to an adaptation means. The adaptation means can comprise a second LMS adaptation means or a zero-forcing adaptation means. The number of tap weight coefficients of the second means for filtering can be less than or equal to the number of the tap weight coefficients of the first means for filtering. The information communication system can include either or both of means for controlling a gain of the means for amplifying in response to the second filtered signal and means for controlling a timing phase of the means for converting in response to the second filtered signal.

According to an exemplary embodiment of the third aspect, at least two tap weight coefficients of the first means for filtering can be constrained. The information communication system can include means for updating a value of at least one tap weight coefficient of the second means for filtering to provide a gain of the second means for filtering that is associated with a change in gain error from the first means for filtering. The information communication system can include means for modifying a gain of the means for amplifying based upon the gain of the second means for filtering, to compensate for the change in gain error from the first means for filtering means. Additionally or alternatively, the information communication system can include means for updating a value of at least one tap weight coefficient of the second means for filtering to provide a timing phase of the second means for filtering that is associated with a change in timing phase error introduced by the first means for filtering, and means for modifying a timing phase of the means for converting based upon the timing phase of the second means for filtering, to compensate for the change in timing phase error introduced by the first means for filtering.

According to an exemplary embodiment of the third aspect, the second means for filtering can comprise either a two-tap filter means or a three-tap filter means. The tap weight coefficients of the two-tap filter means can comprise "a" and "1+b", respectively, and the tap weight coefficients of the three-tap filter means can comprise "a", "1+b", and "−a", respectively. The information communication system can include means for updating the tap weight coefficient "a" according to the equation:

$a[n+1] = a[n] - \alpha*\Delta\theta$, wherein a[n+1] comprises the value of the tap weight coefficient "a" for the next sampling time of the input signal, a[n] comprises the value of the tap weight coefficient "a" for the current sampling time of the input signal, α comprises a first gain constant, and Δθ comprises the change in timing phase error associated with the first means for filtering.

According to an exemplary embodiment of the third aspect, the first means for filtering can comprise N tap weight coefficients, wherein N comprises at least four. For purposes of illustration and not limitation, a third tap weight coefficient $C_3$ and a fourth tap weight coefficient $C_4$ of the first means for filtering can be constrained. The information communication system can include means for updating Δθ according to the equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to the equations:

$\Delta C_3 = \mu*E[n]*X[n-3]$ and $\Delta C_4 = \mu*E[n]*X[n-4]$, respectively, wherein μ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the third aspect, the means for updating the tap weight coefficients can include means for updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein $\gamma$ comprises a "+1" when ((2*n) modulo 4)=0 and comprises a "−1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to an alternative exemplary embodiment of the third aspect, $K_e$ and $K_o$ can each comprise a predetermined value.

According to the third aspect, the information communication system can include means for detecting an information sequence in the first filtered signal. The means for detecting can be responsive to an output of the first means for filtering. The information communication system can include means for reconstructing an information signal from the information sequence. The means for reconstructing can be responsive to an output of the means for detecting. The information communication system can also include means for generating an error signal. The means for generating an error signal can be responsive to the output of the first means for filtering and an output of the means for reconstructing. The means for generating an error signal can generate the error signal E[n] comprising a difference between the output of the first means for filtering and the output of the means for reconstructing.

According to an alternative exemplary embodiment of the third aspect, the first means for filtering can comprise N tap weight coefficients, wherein N comprises at least four. For purposes of illustration and not limitation, a third tap weight coefficient $C_3$ and a fourth tap weight coefficient $C_4$ of the first means for filtering can be constrained. The means for updating tap weight coefficients can include means for updating $\Delta\theta$ according to the equation:

$\Delta\theta=(-\Delta C_3 * K_e - \Delta C_4 * K_o)$, wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein $\mu$ comprises a second gain constant, E[n] comprises an error signal for the current sampling time of the input signal, X[n−3] comprises the value of the input signal at the third previous sampling time of the input signal, and X[n−4] comprises the value of the input signal at the fourth previous sampling time of the input signal. According to the third aspect, the means for updating the tap weight coefficients can include means for updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein $\gamma$ comprises a "+1" when ((2*n) modulo 4)=0 and comprises a "−1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to an alternative exemplary embodiment of the third aspect, $K_e$ and $K_o$ can each comprise a predetermined value. The means for generating an error signal can generate the error signal E[n] comprising a difference between the output of the first means for filtering and the output of the means for reconstructing.

According to the third aspect, the information communication system can include means for updating the tap weight coefficient "b" according to the equation:

$b[n+1]=b[n]-\beta*\Delta\Gamma$, wherein b[n+1] comprises the value of the tap weight coefficient "b" for the next sampling time of the input signal, b[n] comprises the value of the tap weight coefficient "b" for the current sampling time of the input signal, $\beta$ comprises a first gain constant, and $\Delta\Gamma$ comprises the change in gain error from the first means for filtering. According to an exemplary embodiment of the third aspect, the first means for filtering can comprise N tap weight coefficients, wherein N comprises at least four. For purposes of illustration and not limitation, a third tap weight coefficient $C_3$ and a fourth tap weight coefficient $C_4$ of the first means for filtering can be constrained. The means for updating the tap weight coefficient can include means for updating $\Delta\Gamma$ according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein μ comprises a second gain constant, E[n] comprises an error signal for the current sampling time of the input signal, X[n–3] comprises the value of the input signal at the third previous sampling time of the input signal, and X[n–4] comprises the value of the input signal at the fourth previous sampling time of the input signal. According to the third aspect, the means for updating the tap weight coefficient can include means for updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "–1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to an alternative exemplary embodiment of the third aspect, $K_e$ and $K_o$ can each comprise a predetermined value. The means for generating an error signal generates the error signal E[n] comprising a difference between the output of the first means for filtering and the output of the means for reconstructing.

According to an alternative exemplary embodiment of the third aspect, the first means for filtering can comprise N tap weight coefficients, wherein N comprises at least four. For purposes of illustration and not limitation, a third tap weight coefficient $C_3$ and a fourth tap weight coefficient $C_4$ of the first means for filtering can be constrained. The means for updating the tap weight coefficient can include means for updating ΔΓ according to the equation:

$\Delta\Gamma=(-\Delta C_3 *K_o+\Delta C_4 *K_e)$, wherein $\Delta C_3$ and $\Delta C_4$ are updated according to the equations:

$\Delta C_3=\mu *E[n]*X[n-3]$ and $\Delta C_4=\mu *E[n]*X[n-4]$, respectively, wherein μ comprises a second gain constant, E[n] comprises an error signal for the current sampling time of the input signal, X[n–3] comprises the value of the input signal at the third previous sampling time of the input signal, and X[n–4] comprises the value of the input signal at the fourth previous sampling time of the input signal. According to the third aspect, the means for updating the tap weight coefficient can include means for updating $K_e$ and $K_o$ according to the equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "–1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to an alternative exemplary embodiment of the third aspect, $K_e$ and $K_o$ can each comprise a predetermined value. The means for generating an error signal generates the error signal E[n] comprising a difference between the output of the first means for filtering and the output of the means for reconstructing.

According to the third aspect, the information communication system can include means for generating an error signal. The means for generating an error signal can be responsive to the output of the means for reconstructing. The means for generating an error signal can be in communication between an output of the second means for filtering and inputs of the means for controlling the gain and the means for controlling the timing phase. The first means for filtering and the second means for filtering can each comprise a FIR filter means. According to an exemplary embodiment of the third aspect, a disk drive means can comprise the information communication system. At least the means for amplifying, the means for converting, the first means for filtering, the second means for filtering, and at least one of the means for controlling a gain of the means for amplifying and the means for controlling a timing phase of the means for converting can be formed on a monolithic substrate. The information communication system can be compliant with a standard selected from the group consisting of 802.11, 802.11a, 802.11b, 802.11g and 802.11i.

According to a fourth aspect of the present invention, an information communication system includes a variable gain amplifier (VGA) responsive to an input signal of the information communication system. The information communication system includes an analog-to-digital converter (ADC) responsive to an output of the VGA. The information communication system includes a first filter responsive to an output of the ADC. Tap weight coefficients of the first filter can be updated according to a first least mean square (LMS) engine. At least one tap weight coefficient of the first filter can be constrained. The information communication system includes a second filter responsive to an output of the first filter. The number of tap weight coefficients of the second filter can be less than or equal to the number of the tap weight coefficients of the first filter. The information communication system includes a gain controller for controlling gain of the VGA. The gain controller is in communication with the VGA and responsive to the output of the second filter.

According to a fifth aspect of the present invention, an information communication system includes a variable gain amplifier (VGA) responsive to an input signal of the information communication system. The information communication system includes an analog-to-digital converter (ADC) responsive to an output of the VGA. The information communication system includes a first filter responsive to an output of the ADC. Tap weight coefficients of the first filter can be updated according to a first least mean square (LMS) engine. At least one tap weight coefficient of the first filter can be constrained. The information communication system includes a second filter responsive to an output of the first filter. The number of tap weight coefficients of the second filter can be less than or equal to the number of the tap weight coefficients of the first filter. The information communication system includes a timing phase controller for controlling timing phase of the ADC. The timing phase controller can be in communication with the ADC and responsive to an output of the second filter.

According to a sixth aspect of the present invention, an information communication system includes means for amplifying an input signal received by the information communication system to generate an amplified signal. The information communication system includes means for converting the amplified signal into a digital signal to generate a converted signal. The information communication system includes first means for filtering the converted signal to generate a first filtered signal. Tap weight coefficients of the first means for filtering can be updated according to a first least mean square (LMS) adaptation means. At least one tap weight coefficient of the first means for filtering can be constrained. The information communication system includes second means for filtering the first filtered signal to generate a second filtered signal. The number of tap weight coefficients of the second means for filtering can be less than or equal to a number of the tap weight coefficients of the first means for filtering. The information communication system includes means for controlling a gain of the means for amplifying in response to the second filtered signal.

According to a sixth aspect of the present invention, an information communication system includes means for amplifying an input signal received by the information communication system to generate an amplified signal. The information communication system includes means for converting the amplified signal into a digital signal to generate a converted signal. The information communication system includes first means for filtering the converted signal to generate a first filtered signal. Tap weight coefficients of the first means for filtering can be updated according to a first least mean square (LMS) adaptation means. At least one tap weight coefficient of the first means for filtering can be constrained. The information communication system includes second means for filtering the first filtered signal to generate a second filtered signal. The number of tap weight coefficients of the second means for filtering can be less than or equal to a number of the tap weight coefficients of the first means for filtering. The information communication system includes means for controlling a timing phase of the means for converting in response to the second filtered signal.

According to a seventh aspect of the present invention, a computer program for controlling at least one of gain and timing phase performs the steps of: a.) filtering an input signal to generate a first filtered signal in accordance with a first plurality of filter coefficients; b.) updating the first plurality of filter coefficients according to a first least mean square (LMS) process; c.) constraining at least one filter coefficient of the first plurality of filter coefficients; d.) filtering the first filtered signal to generate a second filtered signal in accordance with a second plurality of filter coefficients, wherein the number of filter coefficients of the second plurality of filter coefficients can be less than or equal to the number of the filter coefficients of the first plurality of filter coefficients; e.) outputting a gain control signal in response to the second filtered signal; and f.) outputting a timing phase control signal in response to the second filtered signal.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIGS. 3A and 3B are flowcharts illustrating steps for controlling at least one of gain and timing phase, in accordance with an exemplary embodiment of the present invention.

DETAILED DESCRIPTION OF THE PREFERRED EMBODIMENTS

Exemplary embodiments of the present invention are directed to a system and method for controlling gain and timing phase in the presence of a first Least Mean Square (LMS) filter using a second adaptive filter. According to exemplary embodiments, in an information communication system, such as, for example, a receiver, a disk drive or the like, a simple secondary filter, having tap weight coefficients updated according to an adaptive algorithm such as, for example, a LMS algorithm, can be added after a primary filter, having tap weight coefficients updated according to a LMS algorithm. At least one tap weight coefficient of the primary filter can be constrained or otherwise not adapted. The simple secondary filter can be added in the loop that implements the gain control and timing phase control of the information communication system. The simple secondary filter can be, for example, a two-tap filter or a three-tap filter. According to exemplary embodiments, the tap weight coefficients of the three-tap filter can be (a, 1+b, −a), and the tap weight coefficients of the two-tap filter can be (a, 1+b).

The simple secondary filter can introduce a slight gain difference between the output of the primary filter and the output of the simple secondary filter to allow the gain control mechanism and the LMS algorithm used to update the tap weight coefficients of the primary filter to each receive the signal amplitude level that each requires for optimal performance. In other words, the tap weight coefficient "b" of the simple secondary filter can be adapted to account for the change in gain that is "missing" from the LMS adaptation of the tap weight coefficients of the primary filter resulting from the constrained tap weight coefficients. In addition, by using a simple secondary filter, instead of, for example, a gain stage, a slight sampling phase offset can be introduced between the output of the primary filter and the output of the simple secondary filter. In other words, the tap weight coefficient "a" of the simple secondary filter can be adapted to account for the change in timing phase error associated with the primary filter as a result of the constrained tap weight coefficients. The slight sampling phase offset can be used to compensate for any bias in the timing phase recovery.

Figure 1:
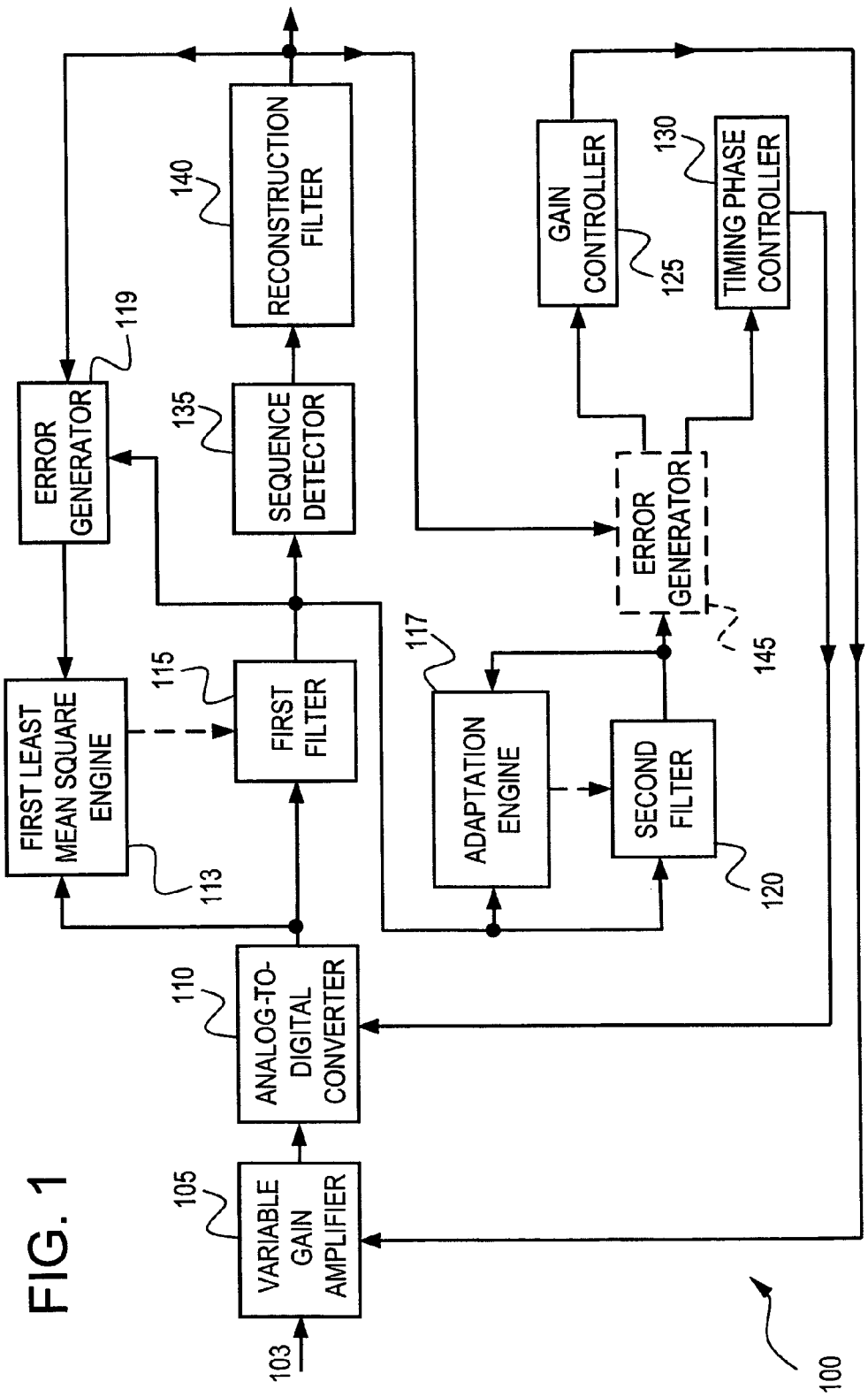
FIG. 1 is a block diagram illustrating a system for controlling gain and timing phase in the presence of a first filter using a second filter, in accordance with an exemplary embodiment of the present invention.

These and other aspects of the present invention will now be described in greater detail. FIG. 1 is a block diagram illustrating a system for controlling gain and timing phase in the presence of a first filter using a second filter, in accordance with an exemplary embodiment of the present invention. An information communication system 100 includes a variable gain amplifier (VGA) 105. VGA 105 is responsive to an input signal 103 to the information communication system 100. The information communication system 100 includes an analog-to-digital converter (ADC) 110. ADC 110 is responsive to an output of VGA 105.

The information communication system 100 includes a first filter 115. According to exemplary embodiments, the tap weight coefficients of first filter 115 are updated according to a first LMS engine 113. The first filter 115 can be, for example, a Finite Impulse Response (FIR) filter, an Infinite Impulse Response (IIR) filter, or any other suitable type of filter that can use first LMS engine 113 to update the tap weight coefficients of the filter according to the LMS algorithm. First filter 115 can be of any length (i.e., can include any desired number of tap weight coefficients), depending on, for example, the characteristics of the communicated information, the channel through which the information is communicated, the environment and application in which the information communication system 100 is used, and the like. First filter 115 is responsive to an output of ADC 110.

The information communication system 100 can include a sequence detector 135. For example, sequence detector 135 can be a Viterbi detector or the like. Sequence detector 135 is responsive to an output of first filter 115. The information communication system 100 can include a reconstruction filter 140. Reconstruction filter 140 is responsive to an output of sequence detector 135. According to an exemplary embodiment, the first LMS engine 113 is responsive to the output of ADC 110 and to an error signal generated by error generator 119. The error generator 119 is responsive to the output of first filter 115 and an output of the reconstruction filter 140. The error generator 119 generates an error signal comprising the difference between the output of first filter 115 and the output of the reconstruction filter 140.

The information communication system 100 includes a second filter 120. According to exemplary embodiments, the tap weight coefficients of second filter 120 are updated according to an adaptation engine 117. The adaptation engine 117 can comprise, for example, a second LMS engine, a zero-forcing engine or any other suitable type of adaptive filter engine. According to an exemplary embodiment, the adaptation engine 117 can be responsive to the input of second filter 120 and the output of second filter 120. The second filter 120 can be, for example, a FIR filter, an IIR filter, or any other suitable type of filter that can use adaptation engine 117 to update the tap weight coefficients of the filter according to an adaptive algorithm. According to an exemplary embodiment, the complexity of the second filter 120 is less than or equal to the complexity of the first filter 115. In other words, the number of tap weight coefficients of the second filter 120 is less than or equal to the number of tap weight coefficients of the first filter 115. However, second filter 120 can be of any length (i.e., can include any desired number of tap weight coefficients), depending on, for example, the characteristics of the communicated information, the channel through which the information is communicated, the environment and application in which information communication system 100 is used, and the like. Second filter 120 is responsive to an output of the first filter 115.

The information communication system 100 can include a gain controller 125 for controlling the gain of VGA 105. According to an exemplary embodiment, gain controller 125 can be a Zero-Forcing (ZF) Automatic Gain Control (AGC) or any other suitable type of AGC. Gain controller 125 is responsive to an output of the second filter 120. Gain controller 125 is in communication with VGA 105. Additionally or alternatively to gain controller 125, information communication system 100 can include a timing phase controller 130 for controlling the timing phase of ADC 110. Timing phase controller 130 is responsive to an output of the second filter 120. Timing phase controller 130 is in communication with ADC 110.

If the tap weight coefficients of first filter 115 are updated according to first LMS engine 113 using an unconstrained LMS algorithm, all tap weight coefficients of first filter 115 are adapted and the coefficients can converge to values that minimize the Mean Square Error (MSE) of the signal output by first filter 115 (assuming, for example, that gain control and timing phase recovery are stable). To remove the interaction between the LMS algorithm used to update the tap weight coefficients of the first filter 115 and the gain control and timing phase recovery algorithms used to control the VGA 105 and ADC 110, respectively, the LMS algorithm used to update the tap weight coefficients of first filter 115 (through first LMS engine 113) can be constrained in at least two dimensions. Conventionally, to provide the desired isolation between the LMS algorithm used to update the tap weight coefficients of first filter 115 and the gain control and timing phase recovery, two or more tap weight coefficients of the first filter 115 can be constrained or otherwise not adapted so as not to participate in the LMS adaptation process. According to an exemplary embodiment of the present invention, at least one tap weight coefficient of the first filter 115 can be constrained, although any desired number of tap weight coefficients of the first filter 115 can be constrained or otherwise not adapted.

According to an exemplary embodiment of the present invention, at least two tap weight coefficients of first filter 115 are constrained. Consequently, the value of at least one tap weight coefficient of the second filter 120 is updated to provide a gain of the second filter 120 that is associated with a change in gain error from the first filter 115. The gain of the second filter 120 is configured to cause the gain controller 125 to modify a gain of VGA 105 to compensate for the change in gain error from the first filter 115. In addition, the value of at least one tap weight coefficient of the second filter 120 is updated to provide a timing phase of the second filter 120 that is associated with a change in timing phase error introduced by the first filter 115. The timing phase of the second filter 120 is configured to cause the timing phase controller 130 to modify the timing phase of ADC 110 to compensate for the change in timing phase error introduced by the first filter 115.

According to exemplary embodiments, second filter 120 can comprise, for example, a two-tap filter or a three-tap filter, although filters of other lengths can be used, with the tap weight coefficients of the filter updated according to an adaptive algorithm. For example, the tap weight coefficients of the two-tap filter can comprise "a" and "1+b", respectively. The tap weight coefficients of the three-tap filter can comprise "a", "1+b", and "−a", respectively. According to an exemplary embodiment, the values of tap weight coefficients "a" and "b" can be set at predetermined values. However, the values of the tap weight coefficients "a" and "b" can be adapted. To adapt the tap weight coefficients "a" and "b", a characteristic gain of the first filter 115 is defined. Generally, the gain of a FIR filter, having tap weight coefficients updated according to a LMS algorithm, is a function of frequency. For example, for a magnetic recording application or the like, the signal energy is concentrated around approximately one-half the Nyquist frequency of the system.

Consequently, the characteristic gain of the first filter 115 is defined to be the gain of the first filter 115 at one-half of the Nyquist frequency, as described by Equation (2):

$$\Gamma = \sqrt{K_e^2 + K_o^2}. \qquad (2)$$

In Equation (2), $K_e$ is defined according to Equation (3):

$$K_e = \sum_{n=0}^{M} \gamma C_{2n} \qquad (3)$$

where γ=+1 when ((2*n) modulo 4)=0, and γ=−1 otherwise. In Equation (3), each tap weight coefficient $C_{2n}$ represents the value of an even tap weight coefficient (e.g., $C_0$ is the value of the zeroeth tap weight coefficient, $C_2$ is the value of the second tap weight coefficient, etc.). If the first filter 115 is comprised of N tap weight coefficients, M is determined according to Equation (4):

$$M = \text{TRUNCATE}((N-1)/2). \qquad (4)$$

According to exemplary embodiments, the TRUNCATE function truncates the given number to its integer portion, discarding any fractional part. Thus, for example, TRUNCATE(2.9)=2, TRUNCATE(2.5)=2, and TRUNCATE(2)=2. According to Equation (3), therefore, $K_e = C_0 - C_2 + C_4 - C_6 \ldots$, with the length of the resulting equation (and, consequently, the value of $K_e$) depending upon the total number of (even) tap weight coefficients of first filter 115.

In Equation (2), $K_o$ is defined according to Equation (5):

$$K_o = \sum_{n=0}^{P} \gamma C_{2n+1} \qquad (5)$$

where γ=+1 when ((2*n) modulo 4)=0, and γ=−1 otherwise. In Equation (5), each tap weight coefficient $C_{2n+1}$ represents the value of an odd tap weight coefficient (e.g., $C_1$ is the value of the first tap weight coefficient, $C_3$ is the value of the third tap weight coefficient, etc.). If the first filter 115 is comprised of N tap weight coefficients, P is determined according to Equation (6):

$$P = \text{TRUNCATE}(((N-1)/2) - 0.5). \qquad (6)$$

According to Equation (5), therefore, $K_o = C_1 - C_3 + C_5 - C_7 \ldots$, with the length of the resulting equation (and, consequently, the value of $K_o$) depending upon the total number of (odd) tap weight coefficients of first filter 115. According to an alternative exemplary embodiment, highly quantized values of $K_e$ and $K_o$ (e.g., +1 or −1, or any other suitable values) can be used instead of the values calculated according to Equations (3) and (5), respectively.

As noted previously, to isolate adaptation of the LMS algorithm used to update the tap weight coefficients of first filter 115 (through first LMS engine 113) from gain controller 125 and timing phase controller 130, two or more of the tap weight coefficients of first filter 115 are constrained. However, constraining the tap weight coefficients can result in the loss of the change in gain that the constrained tap weight coefficients would have contributed. According to exemplary embodiments, the first filter 115 can comprise N tap weight coefficients, where N can comprise at least four, although N can be any number greater than zero. According to an exemplary embodiment, a third tap weight coefficient $C_3$ and a fourth tap weight coefficient $C_4$ of the first filter 115 are constrained, although additional and/or alternative tap weight coefficients can be constrained. For purposes of illustration and not limitation, if $C_3$ and $C_4$ are the constrained tap weight coefficients, then the missing gain change is represented by Equation (7):

$$\Delta\Gamma = \frac{(-\Delta C_3 * K_o + \Delta C_4 * K_e)}{\Gamma}. \qquad (7)$$

In Equation (7), $\Delta C_3$ is updated according to Equation (8), and $\Delta C_4$ is updated according to Equation (9), as follows:

$$\Delta C_3 = \mu * E[n] * X[n-3] \qquad (8)$$

$$\Delta C_4 = \mu * E[n] * X[n-4]. \qquad (9)$$

In Equations (8) and (9), μ comprises a gain constant or step-size parameter and can be any suitable value, such as, for example, any value between zero and one or any appropriate value. E[n] comprises an error signal for the current sampling time of the input signal 103, representing the difference between the output of the first filter 115 and the output of the reconstruction filter 140. X[n−3] comprises the value of the input signal 103 at a third previous (time-delayed) sampling time of the input signal 103, and X[n−4] comprises the value of the input signal 103 at a fourth previous (time-delayed) sampling time of the input signal 103.

In Equation (7), ΔΓ represents the change in gain error from the adaptation of the LMS algorithm used to update the tap weight coefficients of first filter 115 due to the constraint of tap weight coefficients $C_3$ and $C_4$. Equation (7) can be modified to represent the gain change error due to the constraint of additional and/or alternative tap weight coefficients. For example, if more than two tap weight coefficients are constrained, Equation (7) can include the ΔC term(s) for the additional tap weight coefficients, with the polarity of each ΔC term corresponding to the polarity of the tap weight coefficient as represented in Equations (3) and (5) for $K_e$ and $K_o$, respectively. In addition, common terms that are nearly constant or are large in magnitude can be dropped from Equation (7). Consequently, for purposes of illustration and not limitation, the following simplified equation represents the gain change error resulting from the constraint of tap weight coefficients $C_3$ and $C_4$ of first filter 115:

$$\Delta\Gamma = (-\Delta C_3 * K_o + \Delta C_4 * K_e) \quad (10)$$

In Equation (10), $\Delta C_3$ and $\Delta C_4$ are updated according to Equations (8) and (9), respectively, and $K_e$ and $K_o$ are updated according to Equations (3) and (5), respectively.

The gain change error $\Delta\Gamma$ can cause the improper functioning of, for example, a ZF AGC algorithm in the presence of the constrained LMS algorithm used to update the tap weight coefficients of the first filter 115. According to exemplary embodiments, to allow the LMS algorithm used to update the tap weight coefficients of the first filter 115 to converge properly, the amplitude of the signal input to first filter 115 can be adjusted. For example, if $\Delta\Gamma$ is positive, then the amplitude of the output of VGA 105 can be increased to compensate for the amount of the gain change error. According to exemplary embodiments, the compensation can be accomplished by, for example, reducing the gain of the second filter 120 by the amount $-\Delta\Gamma$. This reduction in the amplitude of the signal output by second filter 120 causes the gain controller 125 to increase the gain of VGA 105 by the corresponding amount. The resultant higher gain value of VGA 105 results in an increase to the signal amplitude of input signal 103, thereby increasing the signal amplitude of the signal output by first filter 115.

Thus, according to exemplary embodiments, the tap weight coefficient "b" of second filter 120 is updated according to Equation (11):

$$b[n+1] = b[n] - \beta * \Delta\Gamma \quad (11)$$

In Equation (11), b[n+1] comprises the value of the tap weight coefficient "b" for the next sampling time of the input signal 103, while b[n] comprises the value of the tap weight coefficient "b" for the current sampling time of the input signal 103. The gain constant $\beta$ can be any suitable value, such as, for example, any value between zero and one or any appropriate value. The gain change error from the first filter 115, $\Delta\Gamma$, is determined according to, for example, Equation (7), Equation (10) or a modified version of either Equation (7) or Equation (10) that accounts for additional and/or alternative constrained tap weight coefficients of first filter 115.

Additionally, there can be a timing phase rotation or error as a result of the constrained LMS algorithm used to update the tap weight coefficients of first filter 115. For example, for a signal component located at approximately one-half the Nyquist frequency of the system, the timing phase rotation or error introduced by the LMS algorithm used to update the tap weight coefficients of first filter 115 can be considered substantially equivalent to the timing phase rotation or error for a two-tap filter with tap weight coefficients ($K_e$, $K_o$). The phase angle for such a filter at approximately one-half the Nyquist frequency would be $TAN^{-1}(K_o/K_e)$. According to exemplary embodiments, the first filter 115 can comprise N tap weight coefficients, where N can comprise at least four, although N can be any number greater than zero. According to the exemplary embodiment, a third tap weight coefficient $C_3$ and a fourth tap weight coefficient $C_4$ of the first filter 115 are constrained, although additional and/or alternative tap weight coefficients can be constrained. For purposes of illustration and not limitation, if $C_3$ and $C_4$ are the constrained tap weight coefficients, then the timing phase error introduced by first filter 115 is represented by Equation (12):

$$\Delta\theta = \frac{(-\Delta C_3 * K_e - \Delta C_4 * K_o)}{K_e^2 + K_o^2}. \quad (12)$$

In Equation (12), $\Delta C_3$ is updated according to Equation (8), $\Delta C_4$ is updated according to Equation (9), and $K_e$ and $K_o$ is updated according to Equations (3) and (5), respectively.

In Equation (12), $\Delta\theta$ represents the change in timing phase error that has been introduced by the LMS algorithm used to update the tap weight coefficients of first filter 115 due to the constraint of tap weight coefficients $C_3$ and $C_4$. Equation (12) can be modified to represent the change in timing phase error due to the constraint of additional and/or alternative tap weight coefficients. For example, if more than two taps are constrained, Equation (12) can include the $\Delta C$ term(s) for the additional tap weight coefficients. In addition, common terms that are nearly constant or are large in magnitude can be dropped from Equation (12). Consequently, for purposes of illustration and not limitation, the following simplified equation represents the timing phase error resulting from the constraint of tap weight coefficients $C_3$ and $C_4$ of first filter 115:

$$\Delta\theta = (-\Delta C_3 * K_e - \Delta C_4 * K_o) \quad (13)$$

In Equation (13), $\Delta C_3$ and $\Delta C_4$ are updated according to Equations (8) and (9), respectively, and $K_e$ and $K_o$ are updated according to Equations (3) and (5), respectively.

According to exemplary embodiments, to allow the LMS algorithm used to update the tap weight coefficients of the first filter 115 to converge properly, the timing phase of the signal input to first filter 115 is adjusted. For example, if $\Delta\theta$ is positive, then the timing phase of the signal output by ADC 110 is shifted or otherwise adjusted to compensate for the amount of the timing phase error. According to exemplary embodiments, the compensation can be accomplished by, for example, rotating or otherwise adjusting the timing phase of the second filter 120 by the amount $-\Delta\theta$. This rotation in the timing phase of the signal output by second filter 120 causes the timing phase controller 130 to rotate or otherwise adjust the timing phase of ADC 110 in the opposite direction by a corresponding amount. The resultant timing phase rotation or adjustment of ADC 110 results in a rotation of the timing phase of input signal 103, thereby rotating or adjusting the timing phase of the signal output by first filter 115.

Thus, according to exemplary embodiments, the tap weight coefficient "a" of second filter 120 is updated according to Equation (14):

$$a[n+1] = a[n] - \alpha * \Delta\theta, \quad (14)$$

In Equation (14), a[n+1] comprises the value of the tap weight coefficient "a" for the next sampling time of the input signal 103, while a[n] comprises the value of the tap weight coefficient "a" for the current sampling time of the input signal 103. The gain constant $\alpha$ can be any suitable value, such as, for example, any value between zero and one or any appropriate value. The change in timing phase error associated with first filter 115, $\Delta\theta$, is determined according to, for example, Equation (12), Equation (13) or a modified version of either Equation (12) or Equation (13) that accounts for additional and/or alternative constrained tap weight coefficients of first filter 115.

According to an exemplary embodiment, information communication system 100 can optionally include an error generator 145. Error generator 145 is responsive to the output of reconstruction filter 140. Error generator 145 is in communication with an output of second filter 120 and inputs of either or both gain controller 125 and timing phase controller 130. According to an alternative exemplary embodiment, instead of a separate error generator 145, gain controller 125 can include an error generator. Gain controller 125 can then be responsive to the output of reconstruction filter 140. According to the alternative exemplary embodiment, timing phase controller 130 can also include an error generator, instead of a separate error generator 145. Consequently, timing phase controller 130 can also be responsive to the output of reconstruction filter 140.

Figure 2:
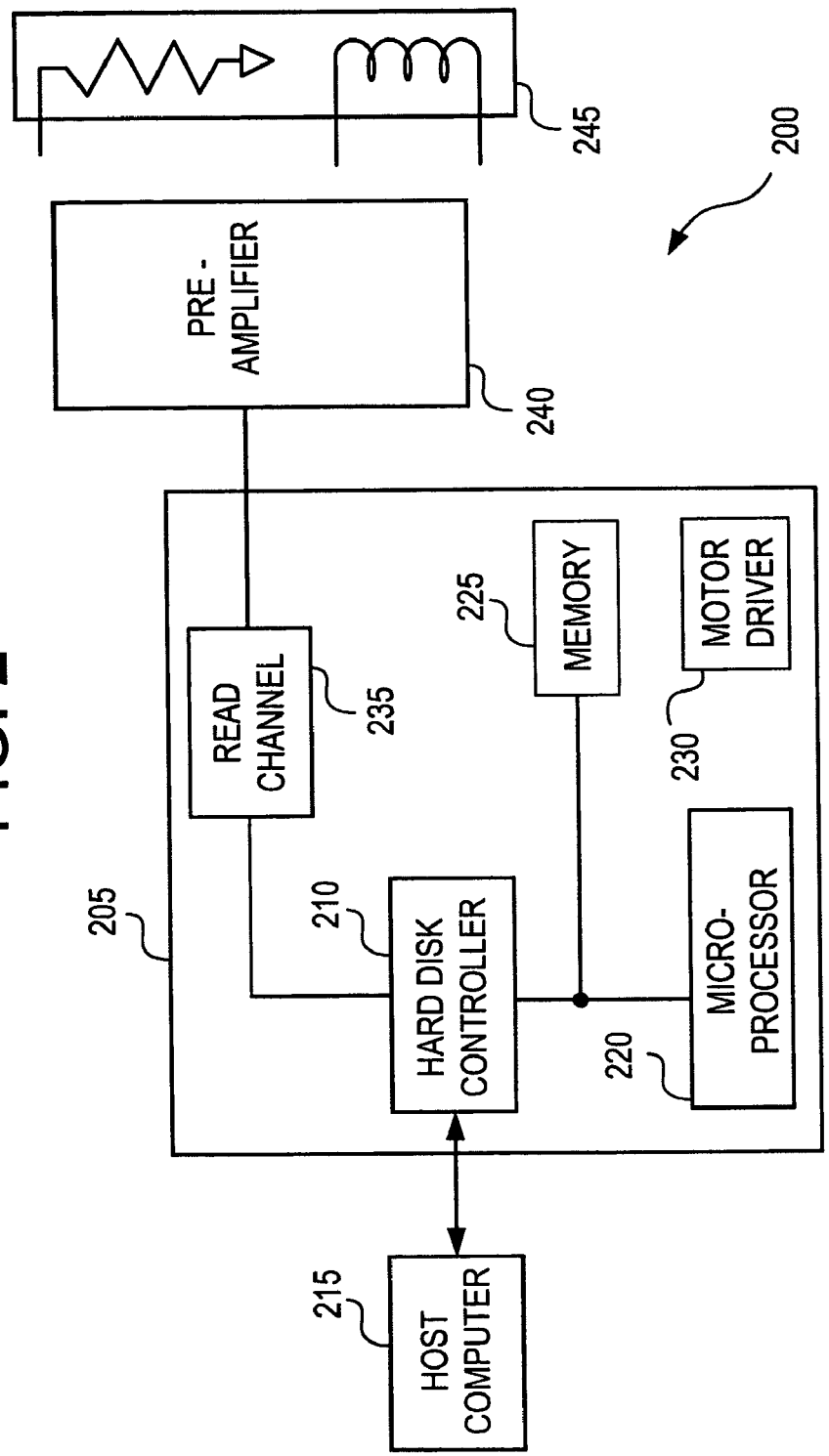
FIG. 2 is a functional block diagram of a disk drive system, in accordance with an exemplary embodiment of the present invention.

According to a preferred embodiment of the present invention, a disk drive can comprise the information communication system 100. FIG. 2 is a functional block diagram of a disk drive system 200, in accordance with an exemplary embodiment of the present invention. The disk drive system 200 includes a disk drive 205 that can be of, for example, a 2-, 4- or 8-channel configuration or any other suitable configuration. The disk drive 205 is comprised of a hard disk controller (HDC) 210 that interfaces with a host device, such as a host computer 215, and further includes a microprocessor 220 and memory 225, each in communication with the HDC 210. A motor driver 230 is also provided. Disk drive 205 also includes a read channel 235, the output of which is supplied to the HDC 210. A pre-amplifier integrated circuit 240 generates an output signal that is supplied as an input to the read channel 235. The pre-amplifier is in communication with a recording head 245, which can be, for example a Magneto-Resistive (MR) or Giant Magneto-Resistive (GMR) recording head or any other suitable recording head. For example, exemplary embodiments of the present invention can be used in or by, for example, read channel 235 or any other suitable component of disk drive system 200, and/or can be performed by the combination of microprocessor 220 and memory 225.

Additionally, exemplary embodiments of the present invention can be used, for example, for communicating information over noisy communication channels and the like. For example, information communication system 100 can be compliant with a standard selected from the group consisting of 802.11, 802.11a, 802.11b, 802.11g and 802.11i, or any other suitable wired or wireless standard. However, information communication system 100 can be used in any device or system that communicates information, including both wired and wireless communication systems, read channel devices, disk drive systems (e.g., those employing read channel devices), other magnetic storage or recording applications, and the like, particularly in systems and devices where a substantial portion of the signal energy in the communicated information signal is located at approximately one-half of the Nyquist frequency of the system.

The input signal 103 can be any suitable type of electrical signal that is capable of communicating electrical information. VGA 105, ADC 110, first filter 115, first LMS engine 113, error generator 119, second filter 120, adaptation engine 117, gain controller 125, timing phase controller 130, sequence detector 135, reconstruction filter 140 and error generator 145 can each be implemented using any suitable means for performing the functions associated with the respective element. VGA 105, ADC 110, first filter 115, first LMS engine 113, error generator 119, second filter 120, adaptation engine 117, gain controller 125, timing phase controller 130, sequence detector 135, reconstruction filter 140 and error generator 145, or any combination thereof, can be formed on, for example, a monolithic substrate. Alternatively, each element, or any combination thereof, can be any suitable type of electrical or electronic component or device that is capable of performing the functions associated with the respective element. According to such an alternative exemplary embodiment, each component or device can be in communication with another component or device using any appropriate type of electrical connection that is capable of carrying electrical information.

Those of ordinary skilled will recognize that the information communication system 100 can include any additional electrical or electronic components, devices or elements that can be used for communicating information signals, including mixers, local oscillators, demodulators, modulators, phase locked loops, power amplifiers, power supplies, additional filters, or any other appropriate components, devices or elements in any suitable combination that can be used for communicating information signals, depending upon the nature and type of information signals to be communicated and the environment in which the information communication system 100 is to be used. For example, the information communication system 100 can form the receiver portion of a transceiver system for transmitting and receiving information, can form portion of a disk drive or other magnetic storage or recording device, or the like.

Figure 3B:
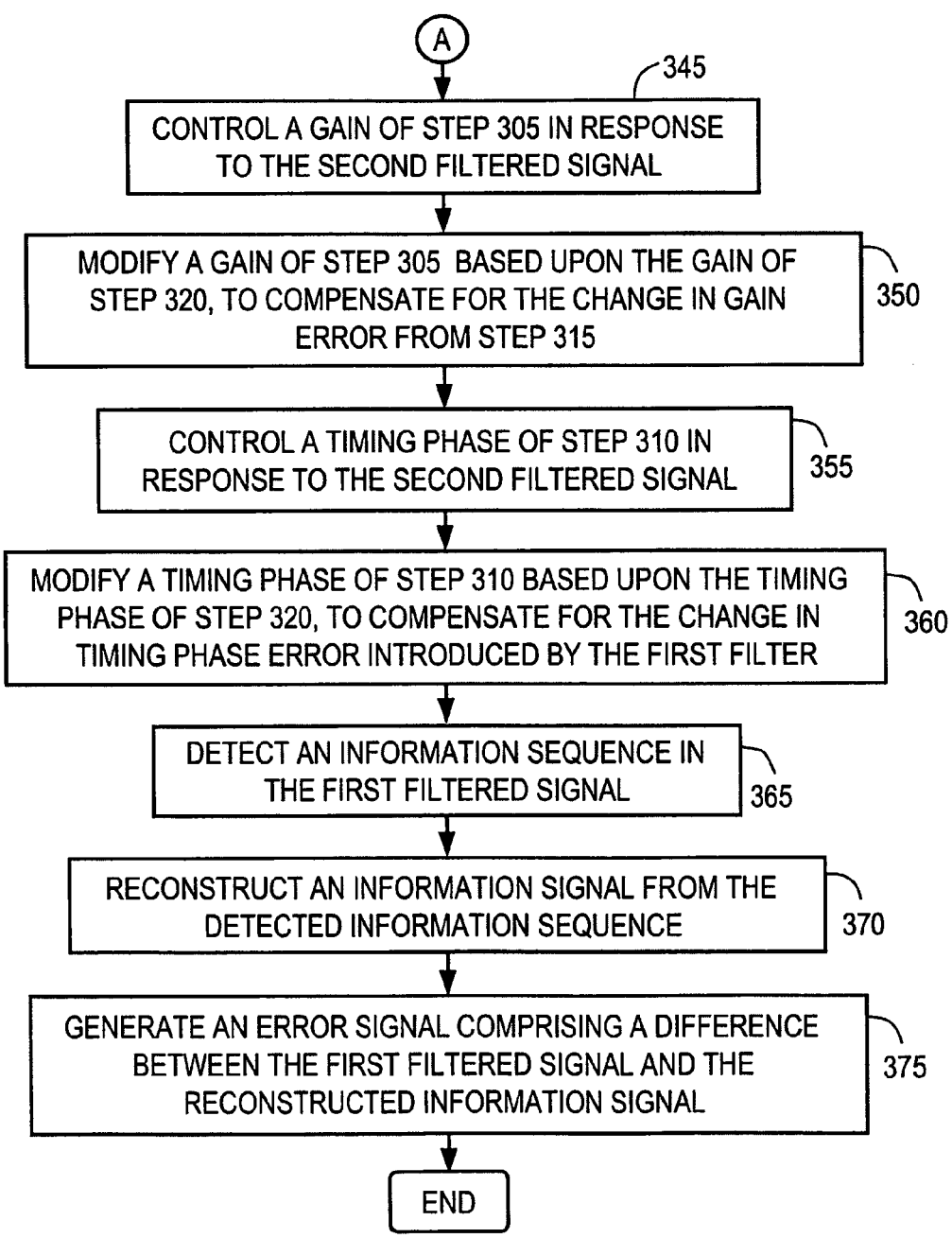

FIGS. 3A and 3B are flowcharts illustrating steps for controlling at least one of gain and timing phase, in accordance with an exemplary embodiment of the present invention. In step 305 of FIG. 3A, an input signal is amplified to generate an amplified signal. In step 310, the amplified signal is converted into a digital signal to generate a converted signal.

In step 315, the converted signal is filtered to generate a first filtered signal in accordance with a first plurality of filter coefficients. The first plurality of filter coefficients are updated according to a first LMS process. The first plurality of filter coefficients can be of any number (i.e., can include any desired number of filter coefficients). According to exemplary embodiments, at least one filter coefficient of the first plurality of filter coefficients can be constrained. For example, two or more filter coefficients of the first plurality of filter coefficients can be constrained.

In step 320, the first filtered signal is filtered to generate a second filtered signal in accordance with a second plurality of filter coefficients. For example, the second plurality of filter coefficients can be updated according to an adaptation process, such as, for example, a second LMS process, a zero-forcing process, or any other suitable adaptation process. According to exemplary embodiments, the number of filter coefficients of the second plurality of filter coefficients is less than or equal to the number of the filter coefficients of the first plurality of filter coefficients. For example, the second plurality of filter coefficients can comprise two or three filter coefficients. However, the second plurality of filter coefficients can be of any number (i.e., can include any desired number of filter coefficients).

In step 325, a value of at least one filter coefficient of the second plurality of filter coefficients is updated to provide a timing phase of Step 320 that is associated with a change in timing phase error introduced by Step 315. According to exemplary embodiments, the two filter coefficients of the second plurality of filter coefficients can comprise "a" and "1+b", respectively, and the three filter coefficients of the second plurality of filter coefficients can comprise "a", "1+b", and "−a", respectively. In step 330, the filter coefficient "a" of the second plurality of filter coefficients is updated according to Equation (14). In step 335, a value of at least one filter coefficient of the second plurality of filter coefficients is updated to provide a gain of Step 320 that is associated with a change in gain error from Step 315. In step 340, the filter coefficient "b" of the second plurality of filter coefficients is updated according to Equation (11).

In step 345 of FIG. 3B, a gain of Step 305 is controlled in response to the second filtered signal. In step 350, a gain of Step 305 is modified based upon the gain of Step 320, to compensate for the change in gain error from Step 315. In step 355, a timing phase of Step 310 is controlled in response to the second filtered signal. In step 360, a timing phase of Step 310 is modified based upon the timing phase of Step 320, to compensate for the change in timing phase error introduced by Step 315.

In step 365, an information sequence is detected in the first filtered signal. In step 370, an information signal is reconstructed from the detected information sequence. In step 375, an error signal is generated that comprises a difference between the first filtered signal and the reconstructed information signal.

Figure 4:
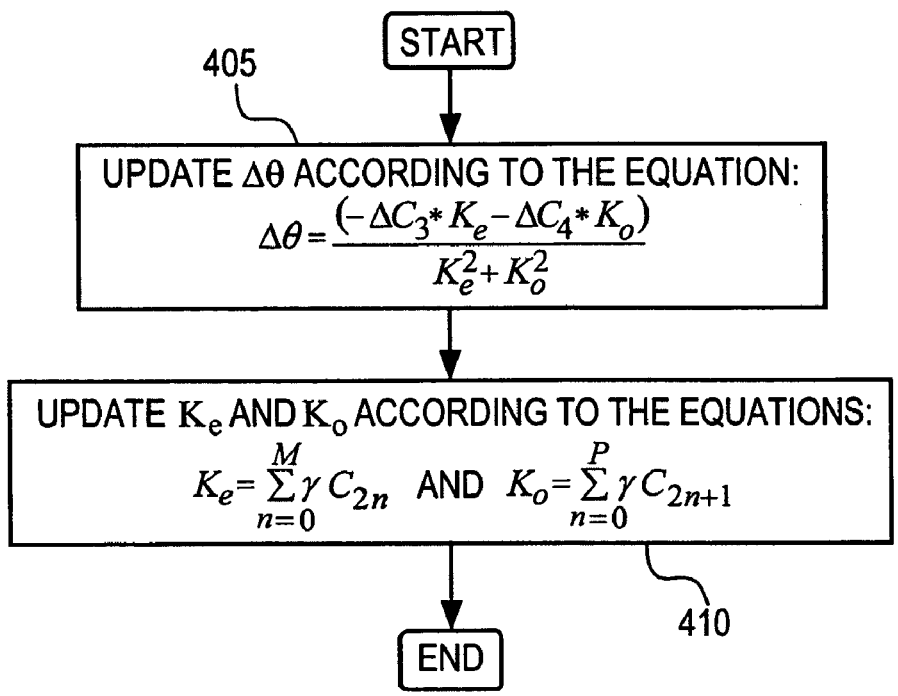
FIG. 4 is a flowchart illustrating steps for updating a filter coefficient "a" of a second plurality of filter coefficients, in accordance with an exemplary embodiment of the present invention.

FIG. 4 is a flowchart illustrating steps for updating a filter coefficient "a" of the second plurality of filter coefficients, in accordance with an exemplary embodiment of the present invention. According to an exemplary embodiment, the first plurality of filter coefficients can comprise N filter coefficients, wherein N comprises at least four, although N can be any number greater than zero. For example, a third filter coefficient $C_3$ and a fourth filter coefficient $C_4$ of the first plurality of filter coefficients can be constrained. In step 405, $\Delta\theta$ is updated according to Equation (12). In step 410, $K_e$ and $K_o$ are updated according to Equations (3) and (5), respectively. According to an alternative exemplary embodiment, $K_e$ and $K_o$ can each comprise a predetermined value.

Figure 5:
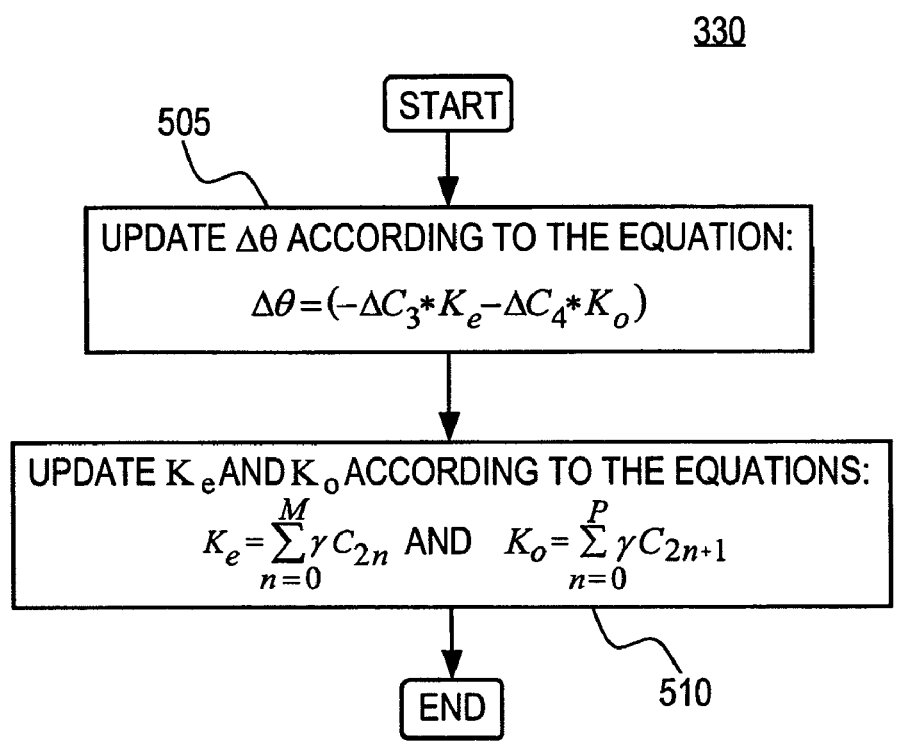
FIG. 5 is a flowchart illustrating steps for updating a filter coefficient "a" of a second plurality of filter coefficients, in accordance with an alternative exemplary embodiment of the present invention.

FIG. 5 is a flowchart illustrating steps for updating a filter coefficient "a" of the second plurality of filter coefficients, in accordance with an alternative exemplary embodiment of the present invention. In step 505, $\Delta\theta$ is updated according to Equation (13). In step 510, $K_e$ and $K_o$ are updated according to Equations (3) and (5), respectively. According to an alternative exemplary embodiment, $K_e$ and $K_o$ can each comprise a predetermined value.

Figure 6:
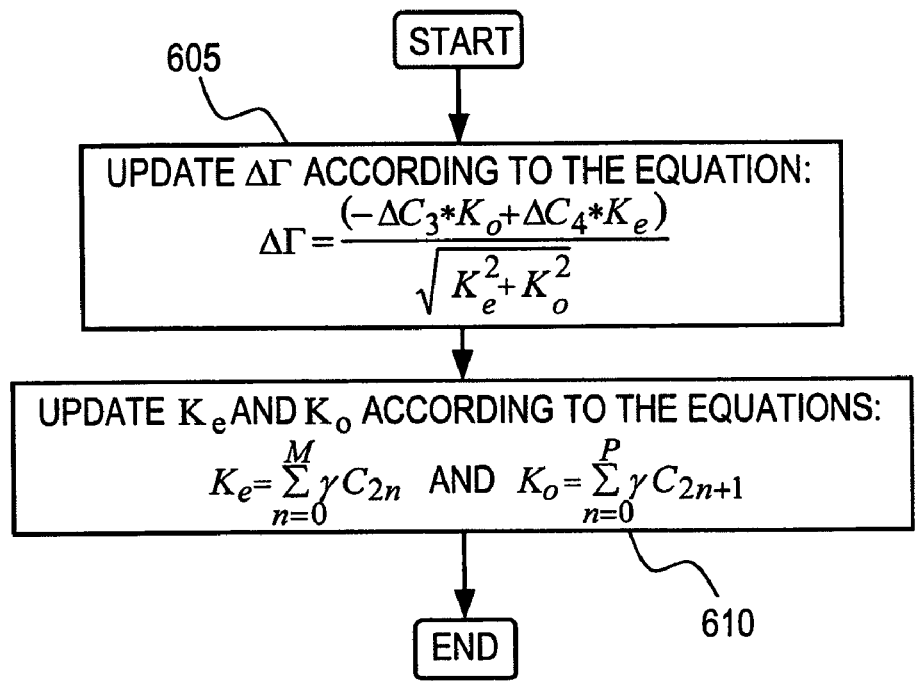
FIG. 6 is a flowchart illustrating steps for updating a filter coefficient "b" of a second plurality of filter coefficients, in accordance with an exemplary embodiment of the present invention.

FIG. 6 is a flowchart illustrating steps for updating a filter coefficient "b" of the second plurality of filter coefficients, in accordance with an exemplary embodiment of the present invention. According to an exemplary embodiment, the first plurality of filter coefficients can comprise N filter coefficients, wherein N comprises at least four, although N can be any number greater than zero. For example, a third filter coefficient $C_3$ and a fourth filter coefficient $C_4$ of the first plurality of filter coefficients can be constrained. In step 605, $\Delta\Gamma$ is updated according to Equation (7). In step 610, $K_e$ and $K_o$ are updated according to Equations (3) and (5), respectively. According to an alternative exemplary embodiment, $K_e$ and $K_o$ can each comprise a predetermined value.

Figure 7:
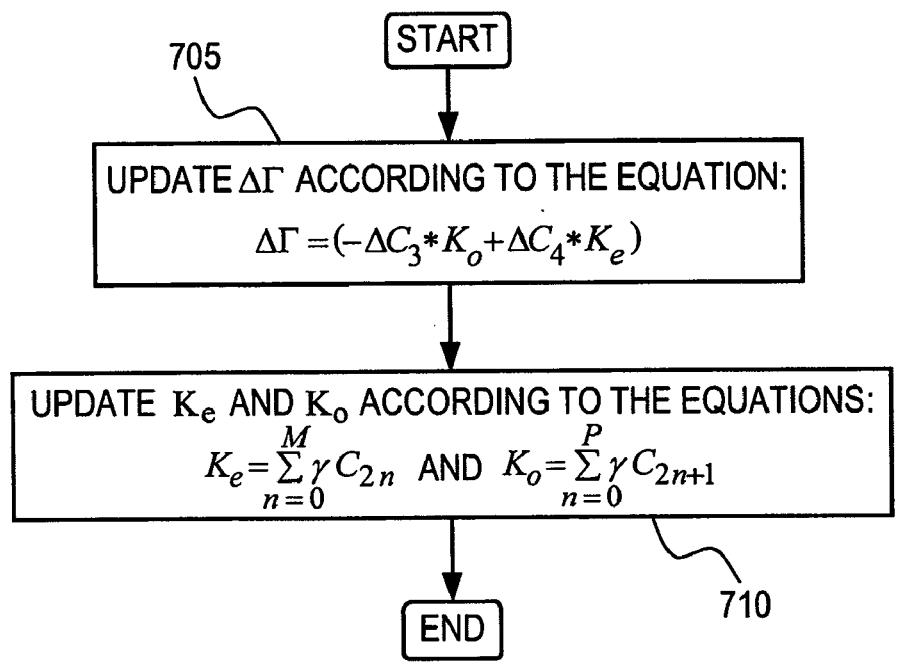
FIG. 7 is a flowchart illustrating steps for updating a filter coefficient "b" of a second plurality of filter coefficients, in accordance with an alternative exemplary embodiment of the present invention.

FIG. 7 is a flowchart illustrating steps for updating a filter coefficient "b" of the second plurality of filter coefficients, in accordance with an alternative exemplary embodiment of the present invention. In step 705, $\Delta\Gamma$ is updated according to Equation (10). In step 710, $K_e$ and $K_o$ are updated according to Equations (3) and (5), respectively. According to an alternative exemplary embodiment, $K_e$ and $K_o$ can each comprise a predetermined value.

Any or all of the steps of a computer program as illustrated in FIGS. 3A, 3B, and 4-7 for controlling at least one of gain and timing phase can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, or transport the program for use by or in connection with the instruction execution system, apparatus, or device. The computer readable medium can be, for example but not limited to, an electronic, magnetic, optical, electromagnetic, infrared, or semiconductor system, apparatus, device, or. More specific examples (a non-exhaustive list) of the computer-readable medium can include the following: a portable computer diskette, a random access memory (RAM), a read-only memory (ROM), an erasable programmable read-only memory (EPROM or Flash memory), an optical fiber, and a portable compact disc read-only memory (CDROM).

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. An information communication system, comprising:
   a variable gain amplifier (VGA),
   wherein the VGA is responsive to an input signal of the information communication system;
   an analog-to-digital converter (ADC),
   wherein the ADC is responsive to an output of the VGA;
   a first filter,
   wherein tap weight coefficients of the first filter are updated according to a first least mean square (LMS) engine,
   wherein the first filter is responsive to an output of the ADC, and
   wherein at least two tap weight coefficients of the first filter are constrained;
   a second filter,
   wherein tap weight coefficients of the second filter are updated according to an adaptation engine,
   wherein the second filter is responsive to an output of the first filter,
   wherein a number of tap weight coefficients of the second filter comprises one of less than and equal to a number of the tap weight coefficients of the first filter,
   wherein the second filter comprises a three-tap filter,
   wherein tap weight coefficients of the three-tap filter comprise "a", "1+b", and "−a", respectively,
   wherein a value of tap weight coefficient "a" of the second filter is updated to provide a timing phase of the second filter that is associated with a change in timing phase error introduced by the first filter,
   wherein the tap weight coefficient "a" is updated according to equation:

$a[n+1]=a[n]-\alpha*\Delta\theta$, wherein a[n+1] comprises a value of the tap weight coefficient "a" for a next sampling time of the input signal,
   wherein a[n] comprises a value of the tap weight coefficient "a" for a current sampling time of the input signal,
   wherein $\alpha$ comprises a first gain constant, and
   wherein $\Delta\theta$ comprises a change in timing phase error associated with the first filter, wherein a value of tap weight coefficient "b" of the second filter is updated to provide a gain of the second filter that is associated with a change in gain error from the first filter, wherein the tap weight coefficient "b" is updated according to equation:

$b[n+1]=b[n]-\beta*\Delta\Gamma$, wherein b[n+1] comprises a value of the tap weight coefficient "b" for a next sampling time of the input signal, wherein b[n] comprises a value of the tap weight coefficient "b" for a current sampling time of the input signal, wherein β comprises a second gain constant, and wherein ΔΓ comprises a change in gain error from the first filter;

a gain controller for controlling gain of the VGA, wherein the gain controller is in communication with the VGA and responsive to the output of the second filter, wherein the gain of the second filter is configured to cause the gain controller to modify a gain of the VGA to compensate for the change in gain error from the first filter; and a timing phase controller for controlling timing phase of the ADC, wherein the timing phase controller is in communication with the ADC and responsive to an output of the second filter, wherein the timing phase of the second filter is configured to cause the timing phase controller to modify a timing phase of the ADC to compensate for the change in timing phase error introduced by the first filter.

2. The information communication system of claim 1, wherein the adaptation engine comprises one of a second LMS engine and a zero-forcing engine.

3. The information communication system of claim 1, wherein the first filter comprises N tap weight coefficients, wherein N comprises at least four, wherein a third tap weight coefficient $C_3$ and a fourth tap weight coefficient $C_4$ of the first filter are constrained, and wherein Δθ is updated according to equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value, wherein μ comprises a third gain constant, wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

4. The information communication system of claim 3, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, wherein M is determined according to equation:

$M =$ TRUNCATE$((N-1)/2)$, and wherein P is determined according to equation:

$P =$ TRUNCATE$(((N-1)/2)-0.5)$.

5. The information communication system of claim 3, wherein $K_e$ and $K_o$ each comprise a predetermined value.

6. The information communication system of claim 3, wherein the error signal E[n] comprises a difference between an output of the first filter and an output of a reconstruction filter, wherein the reconstruction filter is responsive to an output of a sequence detector, and wherein the sequence detector is responsive to an output of the first filter.

7. The information communication system of claim 1, wherein the first filter comprises N tap weight coefficients, wherein N comprises at least four, wherein a third tap weight coefficient $C_3$ and a fourth tap weight coefficient $C_4$ of the first filter are constrained, and wherein Δθ is updated according to equation:

$\Delta\theta = (-\Delta C_3 * K_e - \Delta C_4 * K_o)$, wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value, wherein μ comprises a third gain constant, wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

8. The information communication system of claim 7, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M=\text{TRUNCATE}((N-1)/2)$, and wherein P is determined according to equation:

$P=\text{TRUNCATE}(((N-1)/2)-0.5)$.

9. The information communication system of claim 7, wherein $K_e$ and $K_o$ each comprise a predetermined value.

10. The information communication system of claim 7, wherein the error signal E[n] comprises a difference between an output of the first filter and an output of a reconstruction filter,
wherein the reconstruction filter is in communication with an output of a sequence detector, and
wherein the sequence detector is responsive to an output of the first filter.

11. The information communication system of claim 1, wherein the first filter comprises N tap weight coefficients, wherein N comprises at least four, wherein a third tap weight coefficient $C_3$ and a fourth tap weight coefficient $C_4$ of the first filter are constrained, and wherein ΔΓ is updated according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

12. The information communication system of claim 11, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

wherein γ comprises a "+1" when ((2*n) modulo 4)=0 and comprises a "−1" otherwise,
wherein M is determined according to equation:

$M=\text{TRUNCATE}((N-1)/2)$, and wherein P is determined according to equation:

$P=\text{TRUNCATE}(((N-1)/2)-0.5)$.

13. The information communication system of claim 11, wherein $K_e$ and $K_o$ each comprise a predetermined value.

14. The information communication system of claim 11, wherein the error signal E[n] comprises a difference between an output of the first filter and an output of a reconstruction filter,
wherein the reconstruction filter is responsive to an output of a sequence detector, and
wherein the sequence detector is responsive to an output of the first filter.

15. The information communication system of claim 1, wherein the first filter comprises N tap weight coefficients, wherein N comprises at least four, wherein a third tap weight coefficient $C_3$ and a fourth tap weight coefficient $C_4$ of the first filter are constrained, and wherein ΔΓ is updated according to equation:

$\Delta\Gamma = (-\Delta C_3 * K_o + \Delta C_4 * K_e)$, wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

16. The information communication system of claim 15, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M=\text{TRUNCATE}((N-1)/2)$, and wherein P is determined according to equation:

$P=\text{TRUNCATE}(((N-1)/2)-0.5)$.

17. The information communication system of claim 15, wherein $K_e$ and $K_o$ each comprise a predetermined value.

18. The information communication system of claim 15, wherein the error signal E[n] comprises a difference between an output of the first filter and an output of a reconstruction filter,
   wherein the reconstruction filter is responsive to an output of a sequence detector, and
   wherein the sequence detector is responsive to an output of the first filter.

19. The information communication system of claim 1, comprising:
   a sequence detector, wherein the sequence detector is responsive to an output of the first filter.

20. The information communication system of claim 19, comprising:
   a reconstruction filter, wherein the reconstruction filter is responsive to an output of the sequence detector.

21. The information communication system of claim 20, comprising:
   an error generator in communication between an output of the second filter and inputs of the timing phase controller and the gain controller,
   wherein the error generator generates an error signal comprising a difference between an output of the first filter and an output of the reconstruction filter.

22. The information communication system of claim 20, wherein the timing phase controller comprises an error generator,
   wherein the timing phase controller is responsive to an output of the first filter and an output of the reconstruction filter.

23. The information communication system of claim 20, wherein the gain controller comprises an error generator,
   wherein the gain controller is responsive to an output of the first filter and an output of the reconstruction filter.

24. An information communication system, comprising:
   a variable gain amplifier (VGA) means for amplifying an input signal of the information communication system;
   analog-to-digital converter (ADC) means for converting an output of the VGA means;
   first filter means for filtering an output of said ADC means,
      wherein tap weight coefficients of the first filter means are updated according to a first least mean square (LMS) engine means,
      wherein the first filter means is responsive to an output of the ADC means, and
      wherein at least two tap weight coefficients of the first filter means are constrained;
   second filter means for filtering an output of said first filter means,
      wherein tap weight coefficients of the second filter means are updated according to adaptation engine means for updating a tap weight coefficient,
      wherein the second filter means is responsive to an output of the first filter means,
      wherein a number of tap weight coefficients of the second filter means comprises one of less than and equal to a number of the tap weight coefficients of the first filter means,
      wherein the second filter means comprises a three-tap filter means,
      wherein tap weight coefficients of the three-tap filter means comprise "a", "1+b", and "−a", respectively,
      wherein a value of tap weight coefficient "a" of the second filter means is updated to provide a timing phase of the second filter means that is associated with a change in timing phase error introduced by the first filter means,
      wherein the tap weight coefficient "a" is updated according to equation:

$a[n+1]=a[n]-\alpha*\Delta\theta$, wherein a[n+1] comprises a value of the tap weight coefficient "a" for a next sampling time of the input signal,
         wherein a[n] comprises a value of the tap weight coefficient "a" for a current sampling time of the input signal,
         wherein α comprises a first gain constant, and
         wherein Δθ comprises a change in timing phase error associated with the first filter means,
      wherein a value of tap weight coefficient "b" of the second filter means is updated to provide a gain of the second filter means that is associated with a change in gain error from the first filter means,
      wherein the tap weight coefficient "b" is updated according to equation:

$b[n+1]=b[n]\beta*\Delta\Gamma$, wherein b[n+1] comprises a value of the tap weight coefficient "b" for a next sampling time of the input signal,
         wherein b[n] comprises a value of the tap weight coefficient "b" for a current sampling time of the input signal,
         wherein β comprises a second gain constant, and
         wherein ΔΓ comprises a change in gain error from the first filter means;
   gain controller means for controlling gain of the VGA means,
      wherein the gain controller means is in communication with the VGA means and responsive to the output of the second filter means,
      wherein the gain of the second filter means is configured to cause the gain controller means to modify a gain of the VGA means to compensate for the change in gain error from the first filter means; and
   timing phase controller means for controlling timing phase of the ADC means,
      wherein the timing phase controller means is in communication with the ADC means and responsive to an output of the second filter means,
      wherein the timing phase of the second filter means is configured to cause the timing phase controller means to modify a timing phase of the ADC means to compensate for the change in timing phase error introduced by the first filter means.

25. The information communication system of claim 24, wherein the adaptation engine means comprises one of second LMS engine means and zero-forcing engine means for updating a tap weight coefficient.

26. The information communication system of claim 24, wherein the first filter means comprises N tap weight coefficients, wherein N comprises at least four, wherein a third tap weight coefficient $C_3$ and a fourth tap weight coefficient $C_4$ of the first filter means are constrained, and wherein Δθ is updated according to equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

27. The information communication system of claim 26, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively,
wherein γ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

28. The information communication system of claim 26, wherein $K_e$ and $K_o$ each comprise a predetermined value.

29. The information communication system of claim 26, wherein the error signal E[n] comprises a difference between an output of the first filter means and an output of reconstruction filter means for reconstructing an information signal based on an output of a sequence detector means,
wherein the sequence detector means is responsive to an output of the first filter means.

30. The information communication system of claim 24, wherein the first filter means comprises N tap weight coefficients, wherein N comprises at least four, wherein a third tap weight coefficient $C_3$ and a fourth tap weight coefficient $C_4$ of the first filter means are constrained, and wherein $\Delta\theta$ is updated according to equation:

$\Delta\theta = (-\Delta C_3 * K_e - \Delta C_4 * K_o)$, wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

31. The information communication system of claim 30, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

32. The information communication system of claim 30, wherein $K_e$ and $K_o$ each comprise a predetermined value.

33. The information communication system of claim 30, wherein the error signal E[n] comprises a difference between an output of the first filter means and an output of reconstruction filter means for reconstructing an information signal based on an output of a sequence detector means,
wherein the sequence detector means is responsive to an output of the first filter means.

34. The information communication system of claim 24, wherein the first filter means comprises N tap weight coefficients, wherein N comprises at least four, wherein a third tap weight coefficient $C_3$ and a fourth tap weight coefficient $C_4$ of the first filter means are constrained, and wherein $\Delta\Gamma$ is updated according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

35. The information communication system of claim 34, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively,
wherein γ comprises a "+1" when ((2*n) modulo 4)=0 and comprises a "−1" otherwise,
wherein M is determined according to equation:

$M$=TRUNCATE$((N-1)/2)$, and wherein P is determined according to equation:

$P$=TRUNCATE$(((N-1)/2)-0.5)$.

36. The information communication system of claim 34, wherein $K_e$ and $K_o$ each comprise a predetermined value.

37. The information communication system of claim 34, wherein the error signal E[n] comprises a difference between an output of the first filter means and an output of reconstruction filter means for reconstructing an information signal based on an output of a sequence detector means,
wherein the sequence detector means is responsive to an output of the first filter means.

38. The information communication system of claim 24, wherein the first filter means comprises N tap weight coefficients, wherein N comprises at least four, wherein a third tap weight coefficient $C_3$ and a fourth tap weight coefficient $C_4$ of the first filter means are constrained, and wherein ΔΓ is updated according to equation:

$\Delta\Gamma = (-\Delta C_3 * K_o + \Delta C_4 * K_e)$, wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein μ comprises a third gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

39. The information communication system of claim 38, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M$=TRUNCATE$((N-1)/2)$, and wherein P is determined according to equation:

$P$=TRUNCATE$(((N-1)/2)-0.5)$.

40. The information communication system of claim 38, wherein $K_e$ and $K_o$ each comprise a predetermined value.

41. The information communication system of claim 38, wherein the error signal E[n] comprises a difference between an output of the first filter means and an output of reconstruction filter means for reconstructing an information signal based on an output of a sequence detector means, and
wherein the sequence detector means is responsive to an output of the first filter means.

42. The information communication system of claim 24, further comprising sequence detector means for detecting an information sequence based on an output of the first filter means.

43. The information communication system of claim 42, further comprising reconstruction filter means for reconstructing an information signal based on an output of the sequence detector means.

44. The information communication system of claim 43, further comprising error generator means for generating an error signal,
wherein said error generator means is in communication between an output of the second filter means and inputs of the timing phase controller means and the gain controller means, and
wherein said error signal comprises a difference between an output of the first filter means and an output of the reconstruction filter means.

45. The information communication system of claim 43, wherein the timing phase controller means comprises error generator means for generating an error signal based on an output of the first filter means and an output of the reconstruction filter means.

46. The information communication system of claim 43, wherein the gain controller means comprises error generator means for generating an error signal,
wherein the gain controller means is responsive to an output of the first filter means and an output of the reconstruction filter means.

47. An information communication system, comprising:
a variable gain amplifier (VGA), wherein the VGA is responsive to an input signal of the information communication system;
an analog-to-digital converter (ADC), wherein the ADC is responsive to an output of the VGA;
a first filter,
wherein tap weight coefficients of the first filter are updated according to a first least mean square (LMS) engine,
wherein the first filter is responsive to an output of the ADC, and wherein at least one tap weight coefficient of the first filter is constrained;
a second filter,
    wherein the second filter is responsive to an output of the first filter, and
    wherein a number of tap weight coefficients of the second filter comprises one of less than and equal to a number of the tap weight coefficients of the first filter;
a reconstruction filter that is responsive to the output of the first filter; and, at least one of:
    a gain controller for controlling gain of the VGA, wherein the gain controller is in communication with the VGA and responsive to the output of the second filter and an output of the reconstruction filter; and
    a timing phase controller for controlling timing phase of the ADC, wherein the timing phase controller is in communication with the ADC and responsive to an output of the second filter and an output of the reconstruction filter; and
an error generator that signals the at least one of the gain controller and the timing phase controller based on the output of the second filter and an output of the reconstruction filter.

48. The information communication system of claim 47, wherein tap weight coefficients of the second filter are updated according to an adaptation engine.

49. The information communication system of claim 48, wherein the adaptation engine comprises one of a second LMS engine and a zero-forcing engine.

50. The information communication system of claim 47, wherein the second filter comprises one of a two-tap filter and a three-tap filter.

51. The information communication system of claim 50, wherein tap weight coefficients of the two-tap filter comprise "a" and "1+b", respectively, and
    wherein tap weight coefficients of the three-tap filter comprise "a", "1+b", and "−a", respectively.

52. The information communication system of claim 51, wherein the tap weight coefficient "a" is updated according to equation:

$$a[n+1]=a[n]-\alpha*\Delta\theta,$$

wherein a[n+1] comprises a value of the tap weight coefficient "a" for a next sampling time of the input signal,
    wherein a[n] comprises a value of the tap weight coefficient "a" for a current sampling time of the input signal,
    wherein $\alpha$ comprises a first gain constant, and
    wherein $\Delta\theta$ comprises a change in timing phase error associated with the first filter.

53. The information communication system of claim 52, wherein the first filter comprises N tap weight coefficients, wherein N comprises at least four, wherein a third tap weight coefficient $C_3$ and a fourth tap weight coefficient $C_4$ of the first filter are constrained, and wherein $\Delta\theta$ is updated according to equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to equations:

$$\Delta C_3 = \mu*E[n]*X[n-3] \text{ and}$$

$$\Delta C_4 = \mu*E[n]*X[n-4], \text{ respectively,}$$

wherein $K_e$ and $K_o$ are based on at least one of a tap weight coefficient and a predetermined value,
    wherein μ comprises a second gain constant,
    wherein E[n] comprises an error signal for a current sampling time of the input signal,
    wherein X[n−3] comprises a value of the input signal at a third previous sampling time of the input signal, and
    wherein X[n−4] comprises a value of the input signal at a fourth previous sampling time of the input signal.

54. The information communication system of claim 53, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively,
    wherein γ comprises a "+1" when ((2*n) modulo 4)=0 and comprises a "−1" otherwise,
    wherein M is determined according to equation:

$$M = \text{TRUNCATE}((N-1)/2), \text{ and}$$

wherein P is determined according to equation:

$$P = \text{TRUNCATE}(((N-1)/2)-0.5).$$

55. The information communication system of claim 53, wherein $K_e$ and $K_o$ each comprise a predetermined value.

56. The information communication system of claim 53, further comprising:
    a sequence detector,
        wherein the sequence detector is responsive to an output of the first filter;
    the reconstruction filter,
        wherein the reconstruction filter is responsive to an output of the sequence detector; and
    an error generator,
        wherein the error generator is responsive to the output of the first filter and an output of the reconstruction filter, and
        wherein the error generator generates the error signal E[n] comprising a difference between the output of the first filter and the output of the reconstruction filter.

57. The information communication system of claim 52, wherein the first filter comprises N tap weight coefficients, wherein N comprises at least four, wherein a third tap weight coefficient $C_3$ and a fourth tap weight coefficient $C_4$ of the first filter are constrained, and wherein $\Delta\theta$ is updated according to equation:

$$\Delta\theta = (-\Delta C_3 * K_e - \Delta C_4 * K_o),$$

wherein $\Delta C_3$ and $\Delta C_4$ are updated according to equations:

$$\Delta C_3 = \mu*E[n]*X[n-3] \text{ and}$$

$$\Delta C_4 = \mu*E[n]*X[n-4], \text{ respectively,}$$

wherein $K_e$ and $K_o$ are based on at least one of a tap weight coefficient and a predetermined value,
    wherein μ comprises a second gain constant,
    wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

58. The information communication system of claim 57, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and wherein γ comprises a "+1" when ((2*n) modulo 4)=0 and comprises a "−1" otherwise, wherein M is determined according to equation:

$M=$TRUNCATE$((N−1)/2)$, and wherein P is determined according to equation:

$P=$TRUNCATE$(((N−1)/2)−0.5)$.

59. The information communication system of claim 57, wherein $K_e$ and $K_o$ each comprise a predetermined value.

60. The information communication system of claim 57, further comprising:

a sequence detector,
wherein the sequence detector is responsive to an output of the first filter;

the reconstruction filter,
wherein the reconstruction filter is responsive to an output of the sequence detector; and an error generator,
wherein the error generator is responsive to the output of the first filter and an output of the reconstruction filter, and
wherein the error generator generates the error signal E[n] comprising a difference between the output of the first filter and the output of the reconstruction filter.

61. The information communication system of claim 51, wherein the tap weight coefficient "b" is updated according to equation:

$b[n+1]=b[n]−\beta*\Delta\Gamma$, wherein b[n+1] comprises a value of the tap weight coefficient "b" for a next sampling time of the input signal, wherein b[n] comprises a value of the tap weight coefficient "b" for a current sampling time of the input signal, wherein β comprises a first gain constant, and wherein ΔΓ comprises a change in gain error from the first filter.

62. The information communication system of claim 61, wherein the first filter comprises N tap weight coefficients, wherein N comprises at least four, wherein a third tap weight coefficient $C_3$ and a fourth tap weight coefficient $C_4$ of the first filter are constrained, and wherein ΔΓ is updated according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to equations:

$\Delta C_3=\mu*E[n]*X[n-3]$ and $\Delta C_4=\mu*E[n]*X[n-4]$, respectively, wherein $K_e$ and $K_o$ are based on at least one of a tap weight coefficient and a predetermined value, wherein μ comprises a second gain constant, wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

63. The information communication system of claim 62, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, wherein M is determined according to equation:

$M=$TRUNCATE$((N−1)/2)$, and wherein P is determined according to equation:

$P=$TRUNCATE$(((N−1)/2)−0.5)$.

64. The information communication system of claim 62, wherein $K_e$ and $K_o$ each comprise a predetermined value.

65. The information communication system of claim 62, further comprising:

a sequence detector, wherein the sequence detector is responsive to an output of the first filter;

the reconstruction filter, wherein the reconstruction filter is responsive to an output of the sequence detector; and an error generator, wherein the error generator is responsive to the output of the first filter and an output of the reconstruction filter, wherein the error generator generates the error signal E[n] comprising a difference between the output of the first filter and the output of the reconstruction filter.

66. The information communication system of claim 61, wherein the first filter comprises N tap weight coefficients, wherein N comprises at least four, wherein a third tap weight coefficient $C_3$ and a fourth tap weight coefficient $C_4$ of the first filter are constrained, and wherein ΔΓ is updated according to equation:

$\Delta\Gamma=(-\Delta C_3*K_o+\Delta C_4*K_e)$, wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein $\mu$ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

67. The information communication system of claim 66, wherein $K_e$ and $K_o$ are updated according to equations:

$$K_e = \sum_{n=0}^{M} \gamma C_{2n},$$

and $$K_o = \sum_{n=0}^{P} \gamma C_{2n+1},$$

respectively, and
wherein $\gamma$ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

68. The information communication system of claim 66, wherein $K_e$ and $K_o$ each comprise a predetermined value.

69. The information communication system of claim 66, further comprising:
a sequence detector, wherein the sequence detector is responsive to an output of the first filter;
the reconstruction filter, wherein the reconstruction filter is responsive to an output of the sequence detector; and
an error generator, wherein the error generator is responsive to the output of the first filter and an output of the reconstruction filter,
wherein the error generator generates the error signal E[n] comprising a difference between the output of the first filter and the output of the reconstruction filter.

70. The information communication system of claim 47, further comprising:
a sequence detector, wherein the sequence detector is responsive to an output of the first filter;
the reconstruction filter, wherein the reconstruction filter is responsive to an output of the sequence detector; and
an error generator, wherein the error generator is responsive to an output of the reconstruction filter, and
wherein the error generator is in communication with the second filter, the timing phase controller, and the gain controller.

71. The information communication system of claim 70, wherein the timing phase controller is responsive to the output of the reconstruction filter.

72. The information communication system of claim 70, wherein the gain controller is responsive to the output of the reconstruction filter.

73. The information communication system of claim 47, wherein the first filter and the second filter each comprise a Finite Impulse Response filter.

74. A disk drive comprising the information communication system of claim 47.

75. The information communication system of claim 47, wherein at least the VGA, ADC, first filter, second filter, and at least one of the timing phase controller and gain controller are formed on a monolithic substrate.

76. The information communication system of claim 47, wherein the information communication system is compliant with a standard selected from the group consisting of 802.11, 802.11a, 802.11b, 802.11g and 802.11i.

77. The information communication system of claim 47 comprising said reconstruction filter,
wherein said reconstruction filter is separate from said first filter and said second filter.

78. The information communication system of claim 47 wherein said reconstruction filter is connected between said first filter and said at least one of said gain controller and said timing phase controller.

79. The information communication system of claim 78 wherein said second filter is connected between said first filter and said at least one of said gain controller and said timing phase controller.

80. The information communication system of claim 47 wherein said tap weight coefficients of said second filter are generated based on said output of said first filter.

81. The information communication system of claim 80 wherein said tap weight coefficients of said first filter are generated based on said output of said first filter.

82. The information communication system of claim 47 further comprising an adaptation engine that generates said tap weight coefficients of said second filter based on said output of said first filter and based on said output of said second filter.

83. The information communication system of claim 47 wherein said output of said reconstruction filter is generated based on said output of said first filter.

84. A method for controlling at least one of gain and timing phase of a communication system, comprising the steps of:
a.) amplifying an input signal to generate an amplified signal;
b.) converting the amplified signal into a digital signal to generate a converted signal;
c.) filtering the converted signal to generate a first filtered signal in accordance with a first plurality of filter coefficients,
wherein the first plurality of filter coefficients are updated according to a first least mean square (LMS) process, and
wherein at least one filter coefficient of the first plurality of filter coefficients is constrained;
d.) filtering the first filtered signal to generate a second filtered signal in accordance with a second plurality of filter coefficients,
wherein a number of filter coefficients of the second plurality of filter coefficients comprises one of less than and equal to a number of the filter coefficients of the first plurality of filter coefficients;
e.) generating a reconstruction filter output in response to the first filtered signal;

f.) controlling at least one of a gain of step (a.) and a timing phase of step (b.) in response to the second filtered signal and the reconstruction filter output; and g.) controlling the at least one of the gain of step (a.) via a gain controller and the timing phase of step (b.) based on a signal that is generated by an error generator and based on the second filtered signal and the reconstruction filter output.

85. The method of claim 84, wherein the second plurality of filter coefficients are updated according to an adaptation process.

86. The method of claim 85, wherein the adaptation process comprises one of a second LMS process and a zero-forcing process.

87. The method of claim 84, wherein the second plurality of filter coefficients comprises one of two and three filter coefficients.

88. The method of claim 87, wherein the two filter coefficients of the second plurality of filter coefficients comprise "a" and "1+b", respectively, and wherein the three filter coefficients of the second plurality of filter coefficients comprise "a", "1+b", and "−a", respectively.

89. The method of claim 88, further comprising the step of:
g.) updating the filter coefficient "a" according to equation:

$$a[n+1]=a[n]-\alpha*\Delta\theta,$$

wherein a[n+1] comprises a value of the tap weight coefficient "a" for a next sampling time of the input signal, wherein a[n] comprises a value of the tap weight coefficient "a" for a current sampling time of the input signal, wherein α comprises a first gain constant, and wherein Δθ comprises a change in timing phase error associated with step (c.).

90. The method of claim 89, wherein the first plurality of filter coefficients comprises N filter coefficients, wherein N comprises at least four, wherein a third filter coefficient $C_3$ and a fourth filter coefficient $C_4$ of the first plurality of filter coefficients are constrained, and wherein the method further comprises the step of:

h.) updating Δθ according to equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to equations:

$$\Delta C_3=\mu*E[n]*X[n-3] \text{ and}$$

$$\Delta C_4=\mu*E[n]*X[n-4], \text{ respectively,}$$

wherein $K_e$ and $K_o$ are based on at least one of a tap weight coefficient and a predetermined value, wherein μ comprises a second gain constant, wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

91. The method of claim 90, further comprising the step of:
i.) updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively, wherein γ comprises a "+1" when ((2*n) modulo 4)=0 and comprises a "−1" otherwise, wherein M is determined according to equation:

$$M=\text{TRUNCATE}((N-1)/2), \text{ and}$$

wherein P is determined according to equation:

$$P=\text{TRUNCATE}(((N-1)/2)-0.5).$$

92. The method of claim 90, wherein $K_e$ and $K_o$ each comprise a predetermined value.

93. The method of claim 90, further comprising the steps of:

i.) detecting an information sequence in the first filtered signal;

j.) reconstructing an information signal from the detected information sequence; and k.) generating the error signal E[n] comprising a difference between the first filtered signal and the reconstructed information signal.

94. The method of claim 89, wherein the first plurality of filter coefficients comprises N filter coefficients, wherein N comprises at least four, wherein a third filter coefficient $C_3$ and a fourth filter coefficient $C_4$ of the first plurality of filter coefficients are constrained, and wherein the method further comprises the step of:

h.) updating Δθ according to equation:

$$\Delta\theta=(-\Delta C_3*K_e-\Delta C_4*K_o),$$

wherein $\Delta C_3$ and $\Delta C_4$ are updated according to equations:

$$\Delta C_3=\mu*E[n]*X[n-3] \text{ and}$$

$$\Delta C_4=\mu*E[n]*X[n-4], \text{ respectively,}$$

wherein $K_e$ and $K_o$ are based on at least one of a tap weight coefficient and a predetermined value, wherein μ comprises a second gain constant, wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

95. The method of claim 94, further comprising the step of:
i.) updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively, and
wherein $\gamma$ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

96. The method of claim 94, wherein $K_e$ and $K_o$ each comprise a predetermined value.

97. The method of claim 94, further comprising the steps of:
i.) detecting an information sequence in the first filtered signal;
j.) reconstructing an information signal from the detected information sequence; and
k.) generating the error signal E[n] comprising a difference between the first filtered signal and the reconstructed information signal.

98. The method of claim 88, further comprising the step of:
g.) updating the tap weight coefficient "b" according to equation:

$b[n+1] = b[n] - \beta * \Delta\Gamma$, wherein b[n+1] comprises a value of the tap weight coefficient "b" for a next sampling time of the input signal,
wherein b[n] comprises a value of the tap weight coefficient "b" for a current sampling time of the input signal,
wherein $\beta$ comprises a first gain constant, and
wherein $\Delta\Gamma$ comprises a change in gain error from step (c.).

99. The method of claim 98, wherein the first plurality of filter coefficients comprises N filter coefficients, wherein N comprises at least four, wherein a third filter coefficient $C_3$ and a fourth filter coefficient $C_4$ of the first plurality of filter coefficients are constrained, and wherein the method further comprises the step of:
h.) updating $\Delta\Gamma$ according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein $\mu$ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

100. The method of claim 99, further comprising the step of:
i.) updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively,
wherein $\gamma$ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

101. The method of claim 99, wherein $K_e$ and $K_o$ each comprise a predetermined value.

102. The method of claim 99, further comprising the steps of:
i.) detecting an information sequence in the first filtered signal;
j.) reconstructing an information signal from the detected information sequence; and
k.) generating the error signal E[n] comprising a difference between the first filtered signal and the reconstructed information signal.

103. The method of claim 98, wherein the first plurality of filter coefficients comprises N filter coefficients, wherein N comprises at least four, wherein a third filter coefficient $C_3$ and a fourth filter coefficient $C_4$ of the first plurality of filter coefficients are constrained, and wherein the method further comprises the step of:
h.) updating $\Delta\Gamma$ according to equation:

$\Delta\Gamma = (-\Delta C_3 * K_o + \Delta C_4 * K_e)$, wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein $\mu$ comprises a second gain constant,
wherein E[n] comprises an error signal for a current sampling time of the input signal, wherein X[n−3] comprises a value of the input signal at a third previous sampling time of the input signal, and wherein X[n−4] comprises a value of the input signal at a fourth previous sampling time of the input signal.

104. The method of claim 103, further comprising the step of:
   i.) updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2) - 0.5)$.

105. The method of claim 103, wherein $K_e$ and $K_o$ each comprise a predetermined value.

106. The method of claim 103, further comprising the steps of:
   i.) detecting an information sequence in the first filtered signal;
   j.) reconstructing an information signal from the detected information sequence; and
   k.) generating the error signal E[n] comprising a difference between the first filtered signal and the reconstructed information signal.

107. The method of claim 84, further comprising the steps of:
   g.) detecting an information sequence in the first filtered signal;
   h.) reconstructing an information signal from the detected information sequence; and
   i.) generating an error signal, wherein the error signal is associated with the reconstructed information signal.

108. The method of claim 84, wherein the method is compliant with a standard selected from the group consisting of 802.11, 802.11a, 802.11b, 802.11g and 802.11i.

109. A method for controlling at least one of gain and timing phase of a communication system, comprising the steps of:
   a.) amplifying an input signal to generate an amplified signal;
   b.) converting the amplified signal into a digital signal to generate a converted signal;
   c.) filtering the converted signal to generate a first filtered signal in accordance with a first plurality of filter coefficients,
      wherein the first plurality of filter coefficients are updated according to a first least mean square (LMS) process, and
      wherein at least one filter coefficient of the first plurality of filter coefficients is constrained;
   d.) filtering the first filtered signal to generate a second filtered signal in accordance with a second plurality of filter coefficients,
      wherein a number of filter coefficients of the second plurality of filter coefficients comprises one of less than and equal to a number of the filter coefficients of the first plurality of filter coefficients; and
   e.) controlling at least one of a gain of step (a.) via a gain controller and a timing phase of step (b.) in response to the second filtered signal,
   wherein at least two filter coefficients of the first plurality of filter coefficients are constrained, and wherein the method further comprises the steps of:
      f.) updating a value of at least one filter coefficient of the second plurality of filter coefficients to provide a gain of step (d.) that is associated with a change in gain error from step (c.); and
      g.) modifying the gain of step (a.) based upon the gain of step (d.), to compensate for the change in gain error from step (c.).

110. A method for controlling at least one of gain and timing phase of a communication system, comprising the steps of:
   a.) amplifying an input signal to generate an amplified signal;
   b.) converting the amplified signal into a digital signal to generate a converted signal;
   c.) filtering the converted signal to generate a first filtered signal in accordance with a first plurality of filter coefficients,
      wherein the first plurality of filter coefficients are updated according to a first least mean square (LMS) process, and
      wherein at least one filter coefficient of the first plurality of filter coefficients is constrained;
   d.) filtering the first filtered signal to generate a second filtered signal in accordance with a second plurality of filter coefficients,
      wherein a number of filter coefficients of the second plurality of filter coefficients comprises one of less than and equal to a number of the filter coefficients of the first plurality of filter coefficients; and
   e.) controlling at least one of a gain of step (a.) via a gain controller and a timing phase of step (b.) in response to the second filtered signal,
   wherein at least two filter coefficients of the first plurality of filter coefficients are constrained, and where the method further comprises the steps of:
      f.) updating a value of at least one filter coefficient of the second plurality of filter coefficients to provide a timing phase of step (d.) that is associated with a change in timing phase error introduced by step (c.); and
      g.) modifying a timing phase of step (b.) based upon the timing phase of step (d.), to compensate for the change in timing phase error introduced by step (c.).

111. An information communication system, comprising:
   a variable gain amplifier (VGA), wherein the VGA is responsive to an input signal of the information communication system;
   an analog-to-digital converter (ADC), wherein the ADC is responsive to an output of the VGA;
   a first filter,
      wherein tap weight coefficients of the first filter are updated according to a first least mean square (LMS) engine, wherein the first filter is responsive to an output of the ADC, and wherein at least one tap weight coefficient of the first filter is constrained;

a second filter, wherein the second filter is responsive to an output of the first filter, and wherein a number of tap weight coefficients of the second filter comprises one of less than and equal to a number of the tap weight coefficients of the first filter; and, at least one of:

a gain controller for controlling gain of the VGA, wherein the gain controller is in communication with the VGA and responsive to the output of the second filter; and a timing phase controller for controlling timing phase of the ADC, wherein the timing phase controller is in communication with the ADC and responsive to an output of the second filter, wherein at least two tap weight coefficients of the first filter are constrained, wherein a value of at least one tap weight coefficient of the second filter is updated to provide a gain of the second filter that is associated with a change in gain error from the first filter, and wherein the gain of the second filter is configured to cause the gain controller to modify a gain of the VGA to compensate for the change in gain error from the first filter.

112. An information communication system, comprising:

a variable gain amplifier (VGA), wherein the VGA is responsive to an input signal of the information communication system;

an analog-to-digital converter (ADC), wherein the ADC is responsive to an output of the VGA;

a first filter, wherein tap weight coefficients of the first filter are updated according to a first least mean square (LMS) engine, wherein the first filter is responsive to an output of the ADC, and wherein at least one tap weight coefficient of the first filter is constrained;

a second filter, wherein the second filter is responsive to an output of the first filter, and wherein a number of tap weight coefficients of the second filter comprises one of less than and equal to a number of the tap weight coefficients of the first filter; and, at least one of:

a gain controller for controlling gain of the VGA, wherein the gain controller is in communication with the VGA and responsive to the output of the second filter; and a timing phase controller for controlling timing phase of the ADC, wherein the timing phase controller is in communication with the ADC and responsive to an output of the second filter, wherein at least two tap weight coefficients of the first filter are constrained, wherein a value of at least one tap weight coefficient of the second filter is updated to provide a timing phase of the second filter that is associated with a change in timing phase error introduced by the first filter, and wherein the timing phase of the second filter is configured to cause the timing phase controller to modify a timing phase of the ADC to compensate for the change in timing phase error introduced by the first filter.

113. An information communication system, comprising:

means for amplifying an input signal received by the information communication system to generate an amplified signal;

means for converting the amplified signal into a digital signal to generate a converted signal;

first means for filtering the converted signal to generate a first filtered signal, wherein tap weight coefficients of the first means for filtering are updated according to a first least mean square (LMS) adaptation means, wherein at least one tap weight coefficient of the first means for filtering is constrained;

second means for filtering the first filtered signal to generate a second filtered signal, wherein a number of tap weight coefficients of the second means for filtering comprises one of less than and equal to a number of the tap weight coefficients of the first means for filtering;

reconstruction means for generating a reconstruction filter output in response to the first filtered signal;

means for controlling at least one of a gain of the means for amplifying; and a timing phase of the means for converting in response to the second filtered signal and the reconstruction filter output; and error generating means for signaling the means for controlling based on the second filtered signal and the reconstruction filter output.

114. The information communication system of claim 113, wherein tap weight coefficients of the second means for filtering are updated according to adaptation means for updating a tap weight coefficient.

115. The information communication system of claim 114, wherein the adaptation means comprises one of second LMS adaptation means and zero-forcing adaptation means for updating a tap weight coefficient.

116. The information communication system of claim 113, wherein at least two tap weight coefficients of the first means for filtering are constrained, and wherein the information communication system further comprises:

means for updating a value of at least one tap weight coefficient of the second means for filtering to provide a gain of the second means for filtering that is associated with a change in gain error from the first means for filtering; and means for modifying a gain of the means for amplifying based upon the gain of the second means for filtering, to compensate for the change in gain error from the first means for filtering.

117. The information communication system of claim 113, wherein at least two tap weight coefficients of the first means for filtering are constrained, and where the information communication system further comprises:

means for updating a value of at least one tap weight coefficient of the second means for filtering to provide a timing phase of the second means for filtering that is associated with a change in timing phase error introduced by the first means for filtering; and means for modifying a timing phase of the means for converting based upon the timing phase of the second means for filtering, to compensate for the change in timing phase error introduced by the first means for filtering.

118. The information communication system of claim 113, wherein the second means for filtering comprises one of two-tap filter means and three-tap filter means for filtering said first filtered signal.

119. The information communication system of claim 118, wherein tap weight coefficients of the two-tap filter means comprise "a" and "1+b", respectively, and
wherein tap weight coefficients of the three-tap filter means comprise "a", "1+b", and "−a", respectively.

120. The information communication system of claim 119, further comprising:
means for updating the tap weight coefficient "a" according to equation:

$a[n+1]=a[n]-\alpha*\Delta\theta$, wherein a[n+1] comprises a value of the tap weight coefficient "a" for a next sampling time of the input signal,
wherein a[n] comprises a value of the tap weight coefficient "a" for a current sampling time of the input signal,
wherein $\alpha$ comprises a first gain constant, and
wherein $\Delta\theta$ comprises a change in timing phase error associated with the first means for filtering.

121. The information communication system of claim 120, wherein the first means for filtering comprises N tap weight coefficients, wherein N comprises at least four, wherein a third tap weight coefficient $C_3$ and a fourth tap weight coefficient $C_4$ of the first means for filtering are constrained, and wherein the means for updating the tap weight coefficient comprises:
means for updating $\Delta\theta$ according to equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to equations:

$\Delta C_3 = \mu*E[n]*X[n-3]$ and $\Delta C_4 = \mu*E[n]*X[n-4]$, respectively, wherein $K_e$ and $K_o$ are based on at least one of a tap weight coefficient and a predetermined value,
wherein $\mu$ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

122. The information communication system of claim 121, wherein the means for updating the tap weight coefficient comprises:
means for updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively,
wherein $\gamma$ comprises a "+1" when ((2*n) modulo 4)=0 and comprises a "−1" otherwise,
wherein M is determined according to equation:

$M=\text{TRUNCATE}((N-1)/2)$, and wherein P is determined according to equation:

$P=\text{TRUNCATE}(((N-1)/2)-0.5)$.

123. The information communication system of claim 121, wherein $K_e$ and $K_o$ each comprise a predetermined value.

124. The information communication system of claim 121, comprising:
means for detecting an information sequence in the first filtered signal,
wherein the means for detecting is responsive to an output of the first means for filtering;
means for reconstructing an information signal from the information sequence,
wherein the means for reconstructing is responsive to an output of the means for detecting; and
means for generating an error signal,
wherein the means for generating an error signal is responsive to the output of the first means for filtering and an output of the means for reconstructing, and
wherein the means for generating an error signal generates the error signal E[n] comprising a difference between the output of the first means for filtering and the output of the means for reconstructing.

125. The information communication system of claim 120, wherein the first means for filtering comprises N tap weight coefficients, wherein N comprises at least four, wherein a third tap weight coefficient $C_3$ and a fourth tap weight coefficient $C_4$ of the first means for filtering are constrained, and wherein the means for updating the tap weight coefficient comprises:
means for updating $\Delta\theta$ according to equation:

$\Delta\theta=(-\Delta C_3*K_e-\Delta C_4*K_o)$, wherein $\Delta C_3$ and $\Delta C_4$ are updated according to equations:

$\Delta C_3=\mu*E[n]*X[n-3]$ and $\Delta C_4=\mu*E[n]*X[n-4]$, respectively, wherein $K_e$ and $K_o$ are based on at least one of a tap weight coefficient and a predetermined value,
wherein $\mu$ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

126. The information communication system of claim 125, wherein the means for updating the tap weight coefficient comprises:

means for updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively, and
wherein γ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2)-0.5)$.

127. The information communication system of claim 125, wherein $K_e$ and $K_o$ each comprise a predetermined value.

128. The information communication system of claim 125, comprising:
means for detecting an information sequence in the first filtered signal,
wherein the means for detecting is responsive to an output of the first means for filtering;
means for reconstructing an information signal from the information sequence,
wherein the means for reconstructing is responsive to an output of the means for detecting; and
means for generating an error signal,
wherein the means for generating an error signal is responsive to the output of the first means for filtering and an output of the means for reconstructing, and
wherein the means for generating an error signal generates the error signal E[n] comprising a difference between the output of the first means for filtering and the output of the means for reconstructing.

129. The information communication system of claim 119, further comprising:
means for updating the tap weight coefficient "b" according to equation:

$b[n+1] = b[n] - \beta * \Delta\Gamma$, wherein b[n+1] comprises a value of the tap weight coefficient "b" for a next sampling time of the input signal,
wherein b[n] comprises a value of the tap weight coefficient "b" for a current sampling time of the input signal,
wherein β comprises a first gain constant, and
wherein ΔΓ comprises a change in gain error from the first means for filtering.

130. The information communication system of claim 129, wherein the first means for filtering comprises N tap weight coefficients, wherein N comprises at least four, wherein a third tap weight coefficient $C_3$ and a fourth tap weight coefficient $C_4$ of the first means for filtering are constrained, and wherein the means for updating the tap weight coefficient comprises:
means for updating ΔΓ according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to equations:

$\Delta C_3 = \mu * E[n] * X[n-3]$ and $\Delta C_4 = \mu * E[n] * X[n-4]$, respectively, wherein $K_e$ and $K_o$ are based on at least one of a tap weight coefficient and a predetermined value,
wherein μ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

131. The information communication system of claim 130, wherein the means for updating the tap weight coefficient comprises:
means for updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively,
wherein γ comprises a "+1" when ((2*n) modulo 4)=0 and comprises a "−1" otherwise,
wherein M is determined according to equation:

$M = \text{TRUNCATE}((N-1)/2)$, and wherein P is determined according to equation:

$P = \text{TRUNCATE}(((N-1)/2)-0.5)$.

132. The information communication system of claim 130, wherein $K_e$ and $K_o$ each comprise a predetermined value.

133. The information communication system of claim 130, comprising:
means for detecting an information sequence in the first filtered signal,
wherein the means for detecting is responsive to an output of the first means for filtering;
means for reconstructing an information signal from the information sequence,
wherein the means for reconstructing is responsive to an output of the means for detecting; and
means for generating an error signal,
wherein the means for generating an error signal is responsive to the output of the first means for filtering and an output of the means for reconstructing, and wherein the means for generating an error signal generates the error signal E[n] comprising a difference between the output of the first means for filtering and the output of the means for reconstructing.

134. The information communication system of claim 129, wherein the first means for filtering comprises N tap weight coefficients, wherein N comprises at least four, wherein a third tap weight coefficient $C_3$ and a fourth tap weight coefficient $C_4$ of the first means for filtering are constrained, and wherein the means for updating the tap weight coefficient comprises:

means for updating $\Delta\Gamma$ according to equation:

$$\Delta\Gamma = (-\Delta C_3 * K_o + \Delta C_4 * K_e),$$

wherein $\Delta C_3$ and $\Delta C_4$ are updated according to equations:

$$\Delta C_3 = \mu * E[n] * X[n-3] \text{ and}$$

$$\Delta C_4 = \mu * E[n] * X[n-4], \text{ respectively,}$$

wherein $K_e$ and $K_o$ are based on at least one of a tap weight coefficient and a predetermined value,
wherein $\mu$ comprises a second gain constant,
wherein E[n] comprises an error signal for a current sampling time of the input signal,
wherein X[n−3] comprises a value of the input signal at a third previous sampling time of the input signal, and
wherein X[n−4] comprises a value of the input signal at a fourth previous sampling time of the input signal.

135. The information communication system of claim 134, wherein the means for updating the tap weight coefficient comprises:

means for updating $K_e$ and $K_o$ according to equations:

$$K_e = \sum_{n=0}^{M} \gamma C_{2n},$$

and $$K_o = \sum_{n=0}^{P} \gamma C_{2n+1},$$

respectively, and
wherein $\gamma$ comprises a "+1" when ((2*n) modulo 4)=0 and comprises a "−1" otherwise,
wherein M is determined according to equation:

$$M = \text{TRUNCATE}((N-1)/2), \text{ and}$$

wherein P is determined according to equation:

$$P = \text{TRUNCATE}(((N-1)/2) - 0.5).$$

136. The information communication system of claim 134, wherein $K_e$ and $K_o$ each comprise a predetermined value.

137. The information communication system of claim 134, comprising:
means for detecting an information sequence in the first filtered signal,
wherein the means for detecting is responsive to an output of the first means for filtering;
means for reconstructing an information signal from the information sequence,
wherein the means for reconstructing is responsive to an output of the means for detecting; and
means for generating an error signal,
wherein the means for generating an error signal is responsive to the output of the first means for filtering and an output of the means for reconstructing, and
wherein the means for generating an error signal generates the error signal E[n] comprising a difference between the output of the first means for filtering and the output of the means for reconstructing.

138. The information communication system of claim 113, comprising:
means for detecting an information sequence in the first filtered signal,
wherein the means for detecting is responsive to an output of the first means for filtering;
means for reconstructing an information signal from the information sequence,
wherein the means for reconstructing is responsive to an output of the means for detecting; and
means for generating an error signal,
wherein the means for generating an error signal is responsive to an output of the means for reconstructing, and
wherein the means for generating an error signal is in communication between an output of the second means for filtering and inputs of the means for controlling the gain and the means for controlling the timing phase.

139. The information communication system of claim 113, wherein the first means for filtering and the second means for filtering each comprise a Finite Impulse Response filter means.

140. A disk drive comprising the information communication system of claim 113.

141. The information communication system of claim 113, wherein at least the means for amplifying, the means for converting, the first means for filtering, the second means for filtering, and at least one of the means for controlling a gain of the means for amplifying and the means for controlling a timing phase of the means for converting is formed on a monolithic substrate.

142. The information communication system of claim 113, wherein the information communication system is compliant with a standard selected from the group consisting of 802.11, 802.11a, 802.11b, 802.11g and 802.11i.

143. An information communication system, comprising:
a variable gain amplifier (VGA), wherein the VGA is responsive to an input signal of the information communication system;
an analog-to-digital converter (ADC), wherein the ADC is responsive to an output of the VGA;
a first filter,
wherein tap weight coefficients of the first filter are updated according to a first least mean square (LMS) engine,
wherein the first filter is responsive to an output of the ADC, and
wherein at least one tap weight coefficient of the first filter is constrained;
a second filter,
wherein the second filter is responsive to an output of the first filter, and
wherein a number of tap weight coefficients of the second filter comprises one of less than and equal to a number of the tap weight coefficients of the first filter;

at least one of:
- a gain controller for controlling gain of the VGA, wherein the gain controller is in communication with the VGA and responsive to an output of the second filter; and
- a timing phase controller for controlling timing phase of the ADC, wherein the timing phase controller is in communication with the ADC and responsive to an output of the second filter; and
- a first error generator that is responsive to said output of the second filter and an output of a reconstruction filter that is connected between said first filter and said first error generator, wherein said at least one of said gain controller and said timing phase controller is responsive to said first error generator.

144. The information communication system of claim 130 further comprising a second error generator that is responsive to said output of said first filter,
wherein said tap weight coefficients of said first filter are generated based on an output of said second error generator.

145. The information communication system of claim 144 wherein said tap weight coefficients of said first filter are generated based on an output of the reconstruction filter.

146. An information communication system, comprising:
- means for amplifying an input signal received by the information communication system to generate an amplified signal;
- means for converting the amplified signal into a digital signal to generate a converted signal;
- first means for filtering the converted signal to generate a first filtered signal,
  - wherein tap weight coefficients of the first means for filtering are updated according to a first least mean square (LMS) adaptation means,
  - wherein at least one tap weight coefficient of the first means for filtering is constrained;
- second means for filtering the first filtered signal to generate a second filtered signal,
  - wherein a number of tap weight coefficients of the second means for filtering comprises one of less than and equal to a number of the tap weight coefficients of the first means for filtering;

at least one of:
- means for controlling a gain of the means for amplifying in response to the second filtered signal;
- means for controlling a timing phase of the means for converting in response to the second filtered signal; and
- error generating means for generating an output signal in response to said output of the second filter and an output of a reconstruction filter that is connected between said first means for filtering and said error generating means, wherein said at least one of means for controlling a gain and means for controlling a timing phase is responsive to said error generating means.

147. A computer readable medium that stores a computer program, said computer program when executed by a processor, causes the processor to control at least one of gain and timing phase of a communication system by performing the steps of:
- a.) filtering an input signal to generate a first filtered signal in accordance with a first plurality of filter coefficients;
- b.) updating the first plurality of filter coefficients according to a first least mean square (LMS) process;
- c.) constraining at least one filter coefficient of the first plurality of filter coefficients;
- d.) filtering the first filtered signal to generate a second filtered signal in accordance with a second plurality of filter coefficients,
  wherein a number of filter coefficients of the second plurality of filter coefficients comprises one of less than and equal to a number of the filter coefficients of the first plurality of filter coefficients;
- e.) generating a reconstruction filter output in response to the first filtered signal; and
- f.) generating an error generator output in response to the second filtered signal and said reconstruction filter output;
- g.) outputting at least one of a gain control signal and a timing phase control signal in response to the error generator output from step (f.).

* * * * *

UNITED STATES PATENT AND TRADEMARK OFFICE
CERTIFICATE OF CORRECTION

| | | |
|---|---|---|
| PATENT NO. | : 7,505,537 B1 | Page 1 of 1 |
| APPLICATION NO. | : 10/788998 | |
| DATED | : March 17, 2009 | |
| INVENTOR(S) | : Pantas Sutardja | |

It is certified that error appears in the above-identified patent and that said Letters Patent is hereby corrected as shown below:

| | |
|---|---|
| Column 26, Line 6 | Delete "skilled" and insert -- skill -- |
| Column 28, Line 5 | Delete "device, or" and insert -- or device -- |
| Column 31, Line 65 | Insert -- respectively, -- after the equation |
| Column 34, Line 21 | Insert -- - -- after "b[n]" |

Signed and Sealed this

Nineteenth Day of May, 2009

JOHN DOLL
*Acting Director of the United States Patent and Trademark Office*